United States Patent
Yang et al.

(10) Patent No.: US 10,839,922 B2
(45) Date of Patent: Nov. 17, 2020

(54) MEMORY DISTURB DETECTION

(71) Applicant: SanDisk Technologies LLC, Addison, TX (US)

(72) Inventors: Xiang Yang, Santa Clara, CA (US); Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 75 days.

(21) Appl. No.: 15/990,617

(22) Filed: May 26, 2018

(65) Prior Publication Data

US 2019/0362798 A1   Nov. 28, 2019

(51) Int. Cl.
| | | |
|---|---|---|
| *G11C 16/34* | (2006.01) | |
| *G11C 16/16* | (2006.01) | |
| *G11C 16/26* | (2006.01) | |
| *G11C 29/52* | (2006.01) | |
| *G06F 11/10* | (2006.01) | |
| *G11C 11/56* | (2006.01) | |
| *G11C 16/04* | (2006.01) | |

(52) U.S. Cl.
CPC ...... *G11C 16/3431* (2013.01); *G06F 11/1068* (2013.01); *G11C 16/16* (2013.01); *G11C 16/26* (2013.01); *G11C 29/52* (2013.01); *G11C 11/5621* (2013.01); *G11C 11/5671* (2013.01); *G11C 16/0483* (2013.01)

(58) Field of Classification Search
CPC . G11C 16/3431; G11C 16/0483; G11C 16/16; G11C 16/26; G11C 29/52; G11C 11/5621; G11C 11/5671

USPC .................................................... 365/185.02
See application file for complete search history.

(56) References Cited

U.S. PATENT DOCUMENTS

| | | | |
|---|---|---|---|
| 5,920,501 A | 7/1999 | Norman | |
| 7,692,961 B2 | 4/2010 | Eitan | |
| 7,804,718 B2 | 9/2010 | Kim | |
| 8,073,648 B2 * | 12/2011 | Shlick | G11C 11/5621 |
| | | | 702/117 |
| 9,082,492 B2 | 7/2015 | Kwak | |
| 9,147,492 B2 * | 9/2015 | Shim | G11C 16/10 |
| 9,159,426 B1 | 10/2015 | D'Abreu | |
| 9,418,751 B1 * | 8/2016 | Dutta | G11C 16/0483 |
| 9,570,185 B2 | 2/2017 | Mokhlesi | |
| 9,589,644 B2 | 3/2017 | Yip | |
| 9,620,217 B2 | 4/2017 | Lue | |
| 2009/0109755 A1 | 4/2009 | Edan | |

(Continued)

*Primary Examiner* — Sung Il Cho
(74) *Attorney, Agent, or Firm* — Vierra Magen Marcus LLP

(57) ABSTRACT

An apparatus includes an array of memory cells comprising a first sub-block and a second sub-block electrically coupled by a channel. The apparatus also includes a measurement circuit configured to take a first measurement of a first sub-block of memory cells at a first offset threshold and a second measurement of the first sub-block of memory cells at a second offset threshold. The apparatus further includes a detection circuit configured to detect a disturb condition of the first sub-block based on at least one of the first measurement and the second measurement, and to initiate data maintenance in response to the disturb condition of the first sub-block.

24 Claims, 12 Drawing Sheets

(56) References Cited

U.S. PATENT DOCUMENTS

| | | | |
|---|---|---|---|
| 2010/0313084 A1* | 12/2010 | Hida | G06F 11/1068 |
| | | | 714/704 |
| 2013/0007353 A1* | 1/2013 | Shim | G11C 16/14 |
| | | | 711/103 |
| 2013/0114344 A1 | 5/2013 | Sakai | |
| 2013/0159785 A1* | 6/2013 | Hashimoto | G11C 29/52 |
| | | | 714/47.2 |
| 2013/0262749 A1* | 10/2013 | Oikawa | G11C 16/3418 |
| | | | 711/103 |
| 2014/0133232 A1 | 5/2014 | Avila | |
| 2015/0036432 A1* | 2/2015 | Huang | G11C 29/028 |
| | | | 365/185.12 |
| 2015/0085575 A1 | 3/2015 | Tam | |
| 2016/0118132 A1* | 4/2016 | Prins et al. | G11C 16/3431 |
| | | | 714/704 |
| 2016/0124679 A1* | 5/2016 | Huang | G11C 16/349 |
| | | | 711/103 |
| 2016/0141047 A1* | 5/2016 | Sehgal | G11C 11/5642 |
| | | | 365/185.02 |
| 2016/0163393 A1* | 6/2016 | Liang | G06F 11/1068 |
| | | | 365/185.12 |
| 2016/0225461 A1* | 8/2016 | Tuers | G11C 11/5642 |
| 2016/0342458 A1* | 11/2016 | Cai | G11C 16/349 |
| 2017/0132125 A1* | 5/2017 | Cai | G06F 11/10 |
| 2017/0178736 A1 | 6/2017 | Yang | |
| 2018/0188981 A1* | 7/2018 | Alavi | G11C 16/26 |
| 2019/0294358 A1* | 9/2019 | Suzuki | G06F 3/064 |
| 2019/0294367 A1* | 9/2019 | Takada | G06F 3/0679 |

* cited by examiner

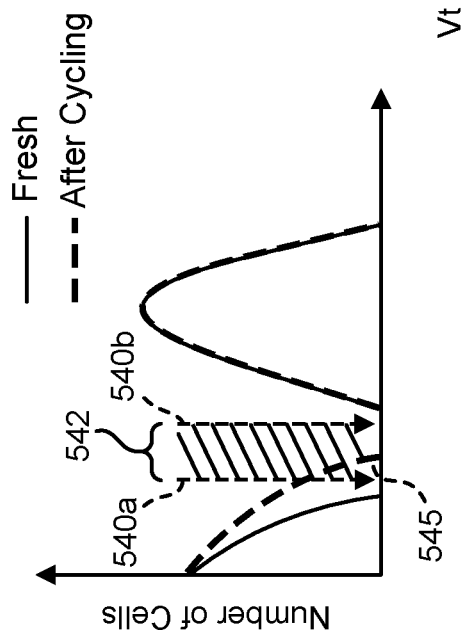
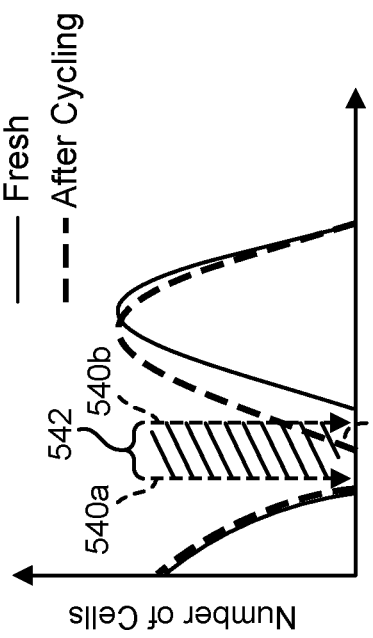
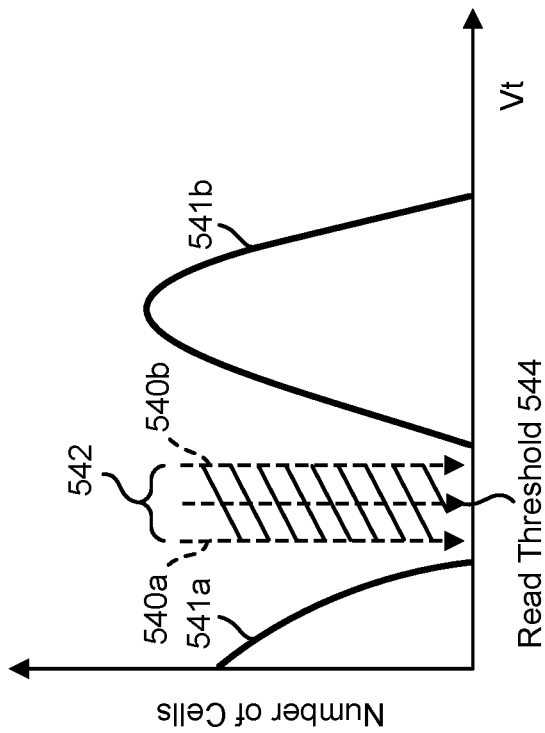
FIG. 5A
FIG. 5B
FIG. 5C

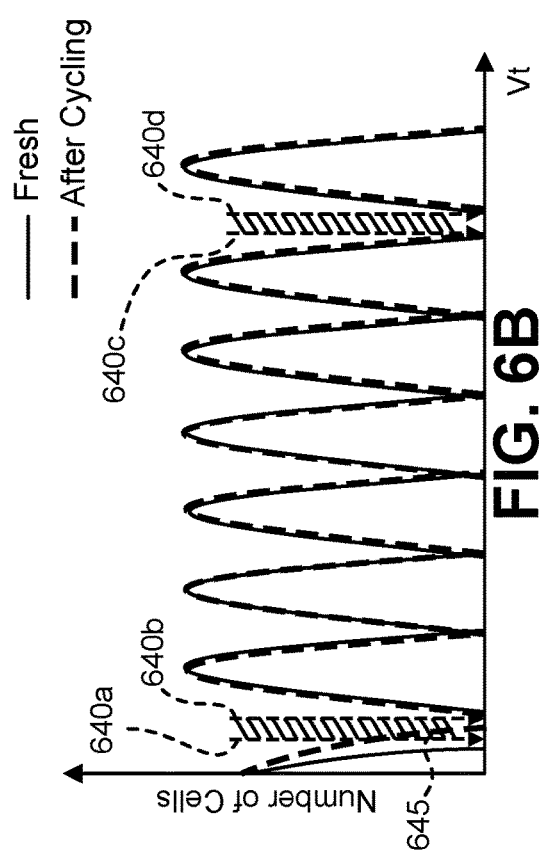
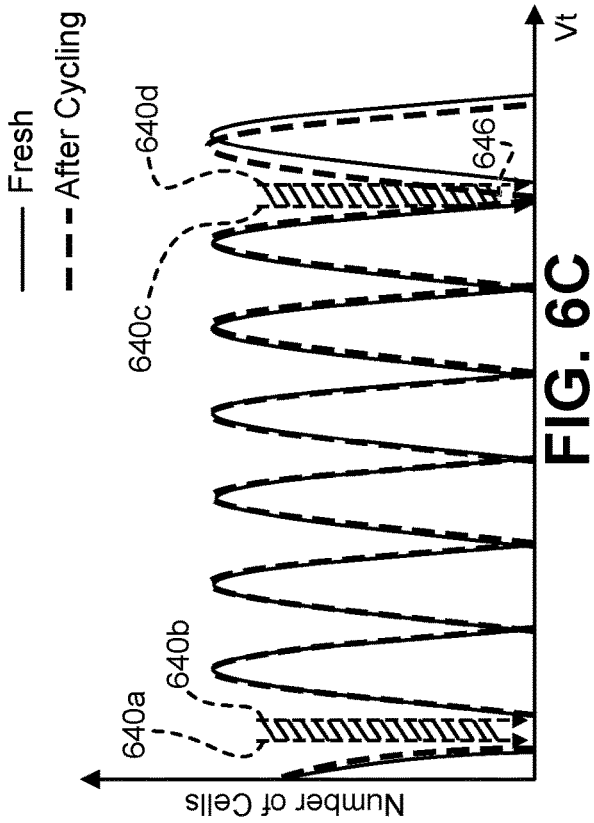
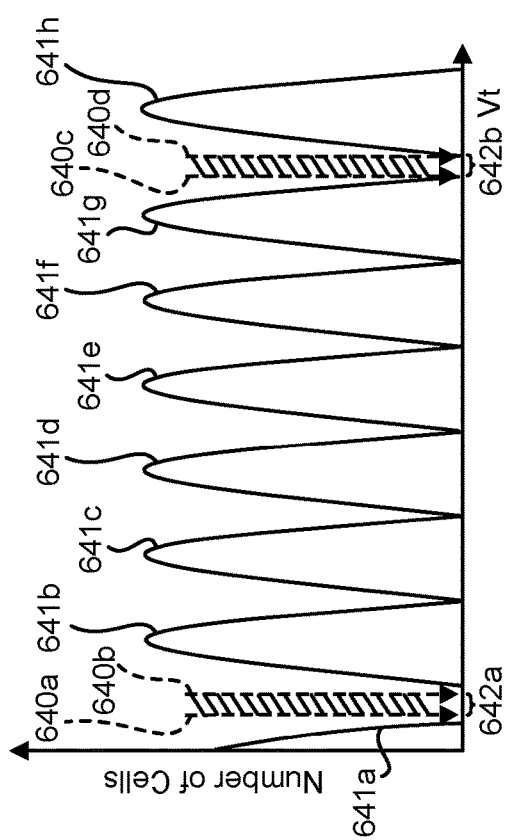
FIG. 6B
FIG. 6C
FIG. 6A

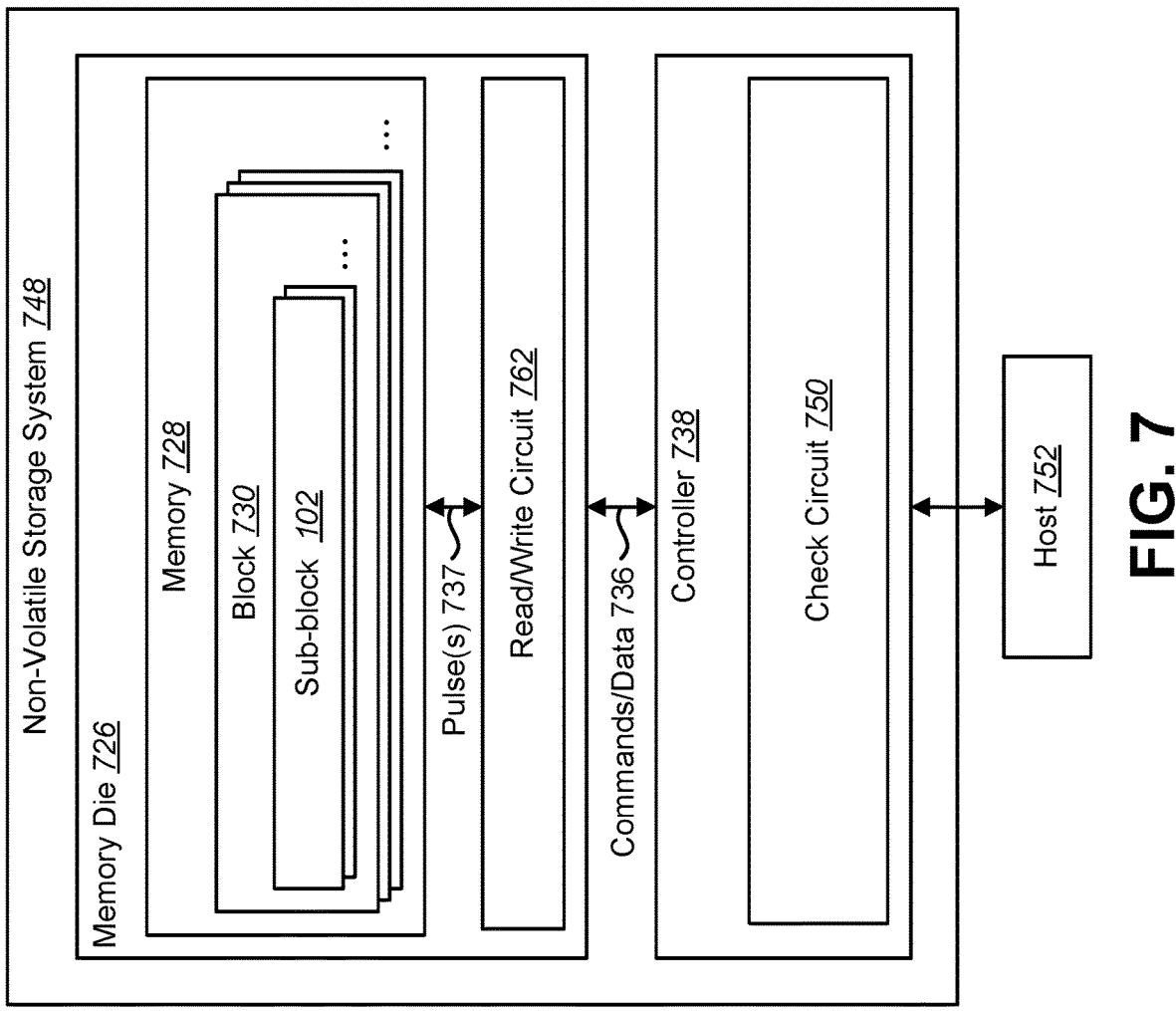

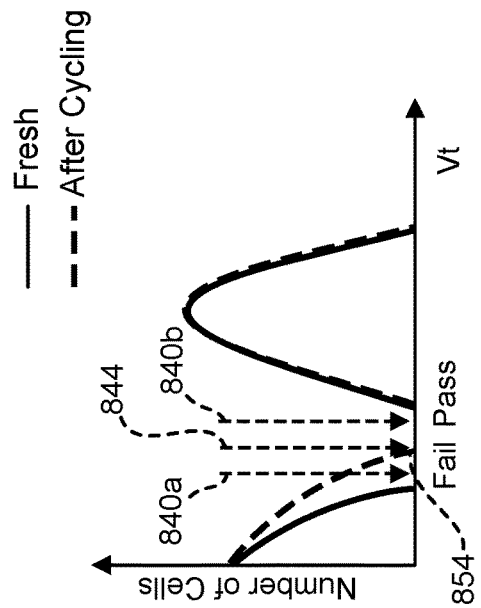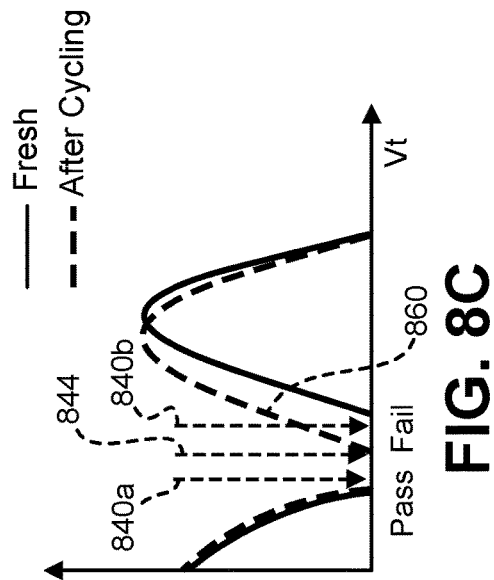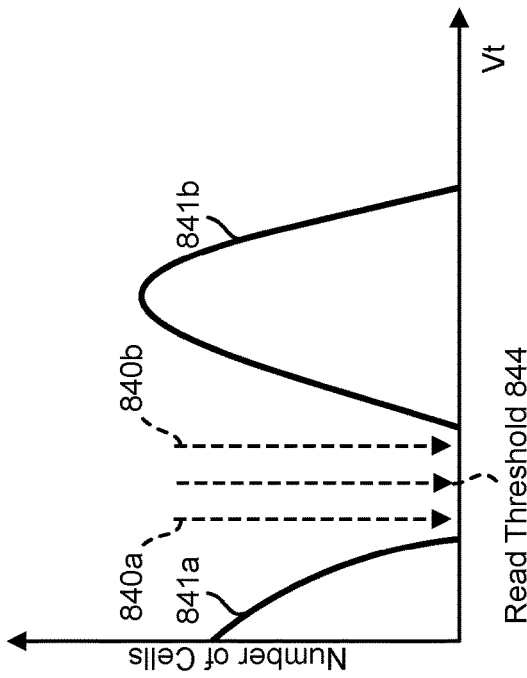

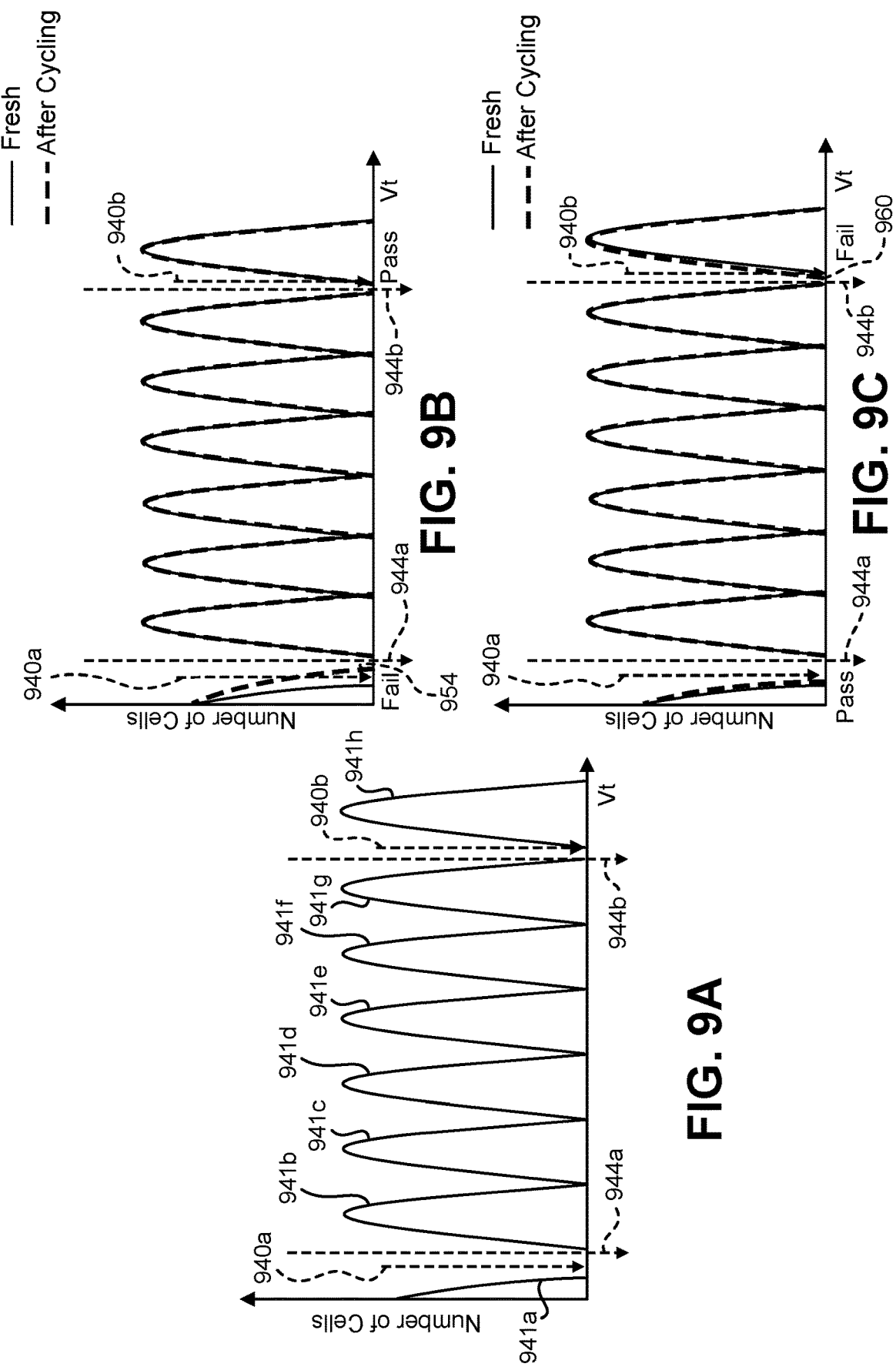

MEMORY DISTURB DETECTION

FIELD OF THE DISCLOSURE

This disclosure is generally related to data storage devices and more particularly to memory disturb detection techniques.

BACKGROUND

Non-volatile data storage devices, such as flash solid state memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more.

Although increasing the number of bits per cell and reducing device feature dimensions may increase a storage density of a memory device, a bit error rate (BER) for data stored at the memory device may also increase. For example, if data states are not maintained with high accuracy, increased errors may occur.

BRIEF DESCRIPTION OF THE DRAWINGS

FIG. 5A is a diagram illustrating an example of target data states and offset thresholds;

FIG. 5B is a diagram illustrating an example of unselected sub-block program disturb;

FIG. 5C is a diagram illustrating an example of unselected sub-block erase disturb;

FIG. 6A is a diagram illustrating another example of target data states and offset thresholds;

FIG. 6B is a diagram illustrating another example of unselected sub-block program disturb;

FIG. 6C is a diagram illustrating another example of unselected sub-block erase disturb;

FIG. 7 is a block diagram illustrating one embodiment of a non-volatile storage system and a host;

FIG. 8A is a diagram illustrating another example of target data states and offset thresholds;

FIG. 8B is a diagram illustrating another example of unselected sub-block program disturb;

FIG. 8C is a diagram illustrating another example of unselected sub-block erase disturb;

FIG. 9A is a diagram illustrating another example of target data states and offset thresholds;

FIG. 9B is a diagram illustrating another example of unselected sub-block program disturb;

FIG. 9C is a diagram illustrating another example of unselected sub-block erase disturb;

DETAILED DESCRIPTION

Figure 1B:
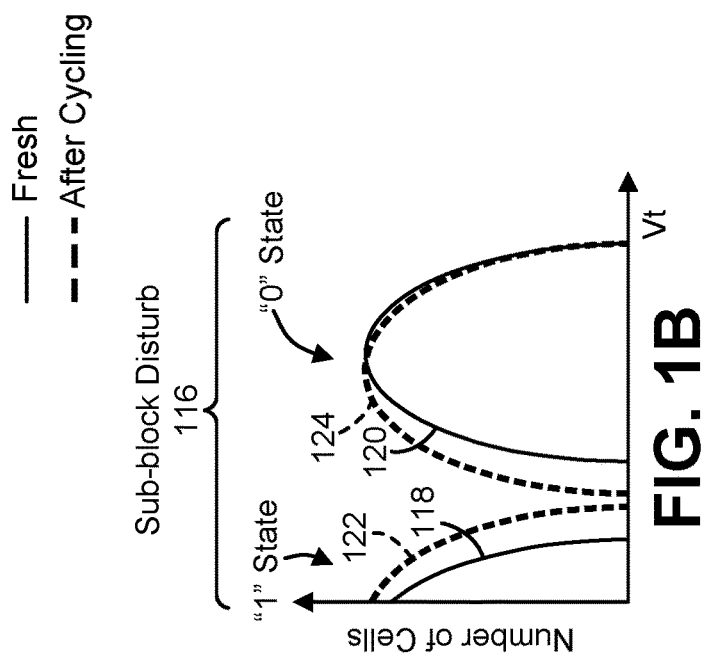
FIG. 1B is a diagram illustrating examples of unselected sub-block disturb.

As used herein, the term "memory" denotes semiconductor memory. Types of semiconductor memory include non-volatile memory and volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM or PCM). Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell. In some cases, more than one data bit per memory cell (i.e., a multi-level or multi-state memory cell) may be provided by programming and reading multiple threshold voltages or threshold voltage ranges.

A block of memory is a set of memory cells. For example, a block of memory (e.g., an array of memory cells) includes memory cells arranged in word lines and bit lines. A "sub-block" of memory is a subset of a block of memory. For instance, a sub-block is a subset of memory cells corresponding to a subset of the word lines of a block of memory. In an embodiment, a sub-block includes 50 word lines in a block of memory, where the block of memory includes more than 50 word lines. A sub-block may denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

Systems and methods for memory disturb detection are disclosed herein. A disturb condition occurs when one or more states (e.g., threshold voltage distributions) of a set of memory cells vary to an unacceptable degree from one or more corresponding target data states. In an embodiment, a "target data state" is a specified, prototype, or anticipated threshold voltage distribution. For example, when memory cells are initially or freshly programmed, the corresponding states (e.g., threshold voltage distribution) of the memory cells substantially align with target data states. Over time, the states may vary from the target data states due to disturb. One type of disturb is unselected sub-block disturb. Further detail regarding unselected sub-block disturb is given in connection with FIG. 1B. In an embodiment, data maintenance (e.g., refresh or restore) is initiated in response to a detected disturb condition as described in further detail herein. In an embodiment, "data maintenance" includes one or more operations to maintain, preserve, restore, or refresh data. In an example, data maintenance includes programming memory cells to more accurately represent data. In another example, data maintenance (e.g., refresh and/or restore) includes sending one or more compensating pulses (e.g., one or more compensating erase pulses and/or one or more compensating program pulses) as described in greater detail below. As used herein a compensating pulse configured to counter a change in an electric characteristic (e.g. threshold voltage or resistance or current flow) away from a target level. The compensating pulse applied to one or more memory cells to change the electric characteristic to more closely match the target level.

In an embodiment, data maintenance (e.g., refresh or recovery) is performed by moving data to another physical location. For example, in one embodiment, data in a first physical location is refreshed or recovered by writing the data to a second physical location and marking the first physical location for invalid and/or eligible for erase in a controller log. In an embodiment, data maintenance (e.g., refresh or recovery) is performed at the same physical location. For example, in one embodiment, data in a physical location is refreshed or recovered by the controller reading the data, erasing the physical location, and writing the data back to the same physical location. In another example, data in a physical location is refreshed or recovered by writing the same data to the same locations (for an MRAM or PCM device, for instance). In yet another example, data in a physical location is refreshed or recovered by sending a programming pulse to all programmed cells in a block such that a threshold voltage (Vt) of each of the cells in a block shifts (e.g., shifts upward to a higher threshold voltage).

Particular examples in accordance with the disclosure are described below with reference to the drawings. In the description, common features may be designated by common reference numbers. Similar or exemplary features may be designated with similar reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

It should be noted that multiple similar elements may be labeled with a number and a letter (e.g., sub-blocks 102a-b). When an element is referred to by the number without a letter, this may generally refer to any one of the illustrated elements with the number, to some of the illustrated elements with the number, to all of the illustrated elements with the number, or to another similar element. For example, a "sub-block 102" may generally refer to one or more of the sub-blocks 102, 102a, and/or 102b illustrated in the figures. When an element is referred to without a number, this may refer to the element in general without limitation to any specific embodiment.

Figure 1A:
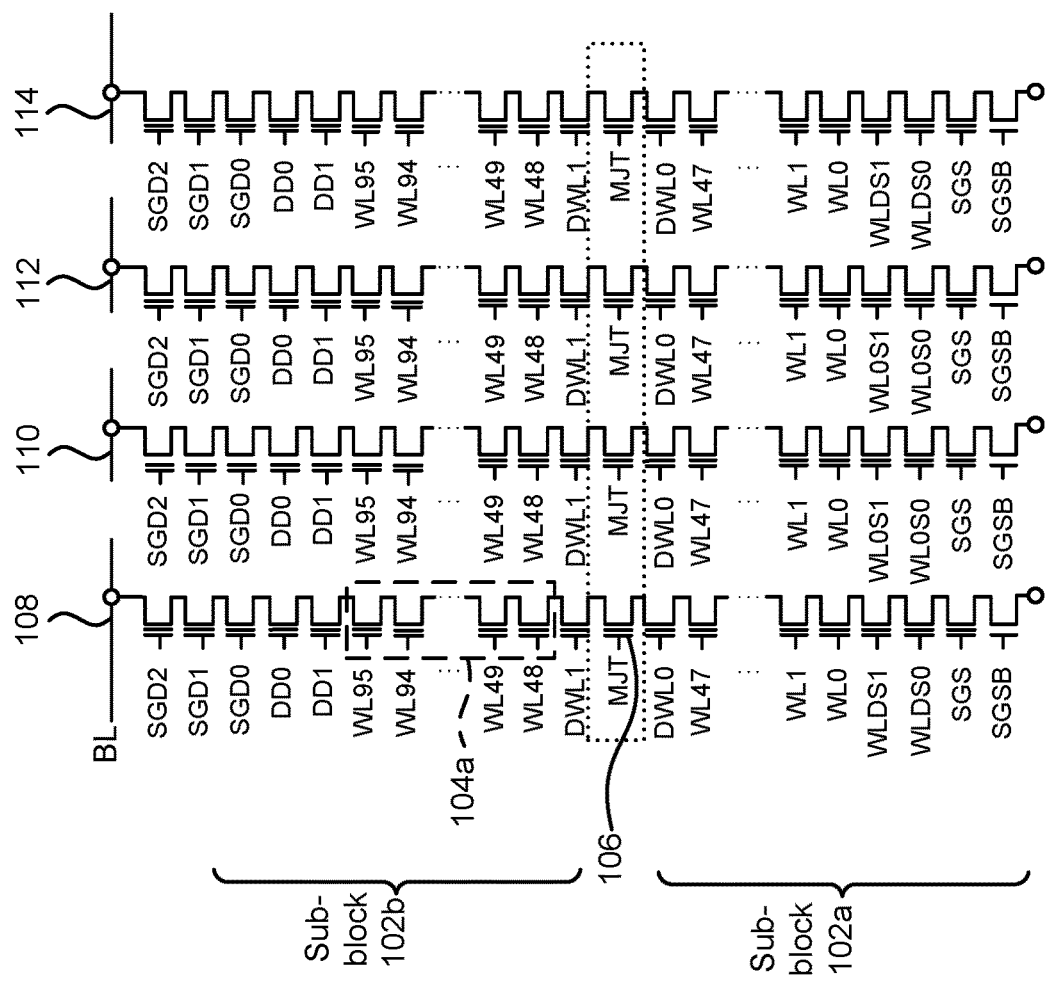
FIG. 1A depicts one embodiment of an array of memory cells including bit and word lines.

FIG. 1A depicts one embodiment of an array of memory cells 104a including four NAND bit lines 108, 110, 112, 114 and a number of word lines WL0-WL95. It should be noted that the reference numeral 104a refers generally to any or all of the memory cells illustrated in FIG. 1A. Each of the NAND bit lines 108, 110, 112, 114 comprises a first portion of the NAND bit line (e.g., corresponding with a first sub-block 102a of memory cells 104a), a second portion of the NAND bit line (e.g., corresponding with a second sub-block 102b of memory cells 104a), and a sub-block select gate transistor 106 arranged between the first portion of the NAND bit line and the second portion of the NAND bit line. Different memory block ranges may be referred to as an "upper sub-block" and a "lower sub-block." For example, the first sub-block 102a may be referred to as a lower sub-block, and the second sub-block 102b may be referred to as an upper sub-block. In an embodiment, the first portion of the NAND bit lines includes memory cells 104a corresponding with word lines WL0-WL47, a memory cell 104a connected to dummy word line DWL0 and arranged between the sub-block select gate transistor 106 and the memory cell 104a connected to word line WL47, and memory cells 104a connected to dummy word lines WLDS1 and WLDS0 and arranged between the memory cell 104a connected to word line WL0 and the source-side select gate connected to SGS. A second portion of the NAND bit lines includes memory cells 104a corresponding to word lines WL48-WL95. Other embodiments include, for example, a different number of word lines and/or bit lines.

It should be noted that although a sub-block select gate transistor 106 separates the sub-blocks 102a-b in FIG. 1A, in other implementations, sub-blocks may not necessarily be separated by a transistor (e.g., joint transistor or sub-block select gate transistor). As illustrated in FIG. 1A, some dummy word lines (DWL1, DWL2) may serve as an electrical buffer between the upper sub-block 102b and the lower sub-block 102a, which can avoid an abrupt voltage change between the two sub-blocks 102a-b.

In one embodiment, during a programming operation for memory cells within the first sub-block 102a, the sub-block select gate transistor 106 may be placed into a conducting state while the memory cells within the first sub-block 102a are programmed. During a subsequent programming operation for memory cells within the second sub-block 102b, the sub-block select gate transistor 106 may be placed into a non-conducting state while the memory cells within the second sub-block 102b are programmed. In this case, the channel under the memory cells within the first sub-block 102a may be floated. The sub-block select gate transistor 106 may comprise an NMOS transistor without a charge trap layer between the channel of the NMOS transistor and the gate of the NMOS transistor. In another embodiment, during an erase operation for memory cells within the second sub-block 102b, the sub-block select gate transistor 106 may be placed into a non-conducting state while the memory cells within the second sub-block 102b are erased.

Specific examples to illustrate a first sub-block 102a erase, program, and read are given as follows, assuming that the second sub-block 102b is currently storing data. For a first sub-block 102a erase, the first sub-block words lines are biased to approximately 0 volts (V), the second sub-block 102b word lines are biased to approximately 20 V, and the channel is biased to approximately 20 V. Now the electrical field between the first sub-block 102a and the channel is approximately 20 V, so the erase can proceed. The electrical field between the second sub-block 102b and the channel is 0V, so the data will be maintained in the second sub-block 102b.

To program the first sub-block 102a, a selected (e.g., target) word line is biased in the first sub-block 102a to a program voltage (VPGM) of 20 V and unselected word lines in the first sub-block 102a are biased to a pass voltage (Vpass) of 10V. All word lines in the second sub-block 102b are biased to Vpass=10V and the channel is biased to 0V. Now the electrical field between the selected word line and the channel is 20V so the selected word line can be programmed. The electrical field between all unselected word lines and the channel is 10V, so the unselected word lines remain un-programmed (e.g., 10V is not enough to program in general). Basically, all other word lines except the selected are fully turned on, serving as "pass transistors."

For a first sub-block 102a read, a selected word line in the first sub-block 102a is biased to a read threshold depending on which state is to be read (e.g., VCG=3V), unselected word lines in the first sub-block 102a are biased to Vread=8V, all word lines in the second sub-block 102b are biased to Vread=8V, and the channel is biased to 0V. Basically, all other word lines except the selected word line are fully turned on, serving as pass transistors.

As illustrated by the foregoing examples, sub-block erase and/or program allows modifying data in a selected sub-block while maintaining data in an unselected sub-block. For example, a sub-block operation virtually divides one physical block into two logical sub-blocks, thus allowing operations on a set of memory cells that is smaller than an entire block of memory. A selected sub-block is a sub-block of memory cells that is selected for an operation (e.g., erase, program, and/or read). An unselected sub-block is a sub-block of memory cells that is not selected for an operation (e.g., erase, program, and/or read). In an embodiment, an unselected sub-block is a sub-block storing (e.g., maintaining) data that is not read, written, or erased in a user data operation (e.g., read, write, or erase) that is performed on another sub-block in the same block. For example, an unselected sub-block may be operated on (e.g., measured, read, erased, and/or programmed) for disturb detection and/or data maintenance performance (e.g., data refresh or restore).

FIG. 1B is a diagram illustrating examples of unselected sub-block disturb 116. A disturb is a change or degradation in threshold voltage of a memory cell (e.g., threshold voltage distribution of a set of memory cells) caused by one or more memory operations. In some cases, one or more memory operations disturb a threshold voltage distribution, causing the threshold voltage distribution to depart (e.g., shift and/or spread) from a target data state. Unselected sub-block disturb occurs due to one or more selected sub-block operations. Because the unselected sub-block shares a channel (e.g., the same physical channel) with the selected sub-block, operations on the selected sub-block cause unselected sub-block disturb in some cases. For instance, unselected sub-block disturb occurs due to erase and/or program operations on a selected sub-block while maintaining data in an unselected sub-block. In one example, assume that the first sub-block 102a (e.g., lower sub-block (LSB)) is storing data while the second sub-block 102b (e.g., upper sub-block (USB)) is erased and/or programmed for a number of cycles. In this example, the first sub-block 102a is the unselected sub-block and the second sub-block 102b is the selected sub-block. The first sub-block 102a may be weakly erased causing the cell distribution to shift to a lower voltage (shift down) during the second sub-block 102b erase operation and/or will be weakly programmed causing the cell distribution to shift to a higher voltage (shift up) during the second sub-block 102b program operation. For example, lower sub-block disturb occurs during upper sub-block cycling (e.g., repeated erasing and/or programming). In another example, upper sub-block disturb occurs during lower sub-block cycling (e.g., repeated erasing and/or programming).

The examples of sub-block disturb 116 are illustrated on a plot, where the vertical axis represents a number of cells (e.g., memory cells) and the horizontal axis represents threshold voltage (Vt) of a set of memory cells. In these examples, each memory cell may store one bit based on the threshold voltage of the memory cell. The value of the bit may be represented by states corresponding to the threshold voltage. For example, if a memory cell has a threshold voltage corresponding to the "0" state, then the memory cell is storing a "0" bit, or if the memory cell has a threshold voltage corresponding to the "1" state, then the memory cell is storing a "1" bit. Due to some variation in threshold voltages between memory cells, the states correspond to threshold voltage distributions.

In FIG. 1B, threshold voltage distributions that have been newly programmed are illustrated with a solid line and may be referred to as fresh threshold voltage distributions 118, 120. For example, immediately upon programming memory cells, the threshold voltage distributions may appear as the solid lines shown in FIG. 1B. As used herein, fresh threshold voltage distributions 118, 120 comprise voltage distributions before a shift or disturb of the distribution occurs (e.g., shortly after data is written), and a target threshold voltage distribution is a specified, prototype, or anticipated threshold voltage distribution, as indicated above. Fresh threshold voltage distributions 118, 120 and target threshold voltage distributions or target data states may be identical or similar.

In FIG. 1B, threshold voltage distributions after cycling 122, 124 are illustrated with a dashed line. Cycling refers to performing one or more operations (e.g., repeated erase and/or program). As described above, when memory cells of a selected sub-block are repeatedly erased and/or programmed, unselected sub-block disturb may occur.

As illustrated by the examples of sub-block disturb 116, the threshold voltage distributions after cycling 122, 124 have varied from the fresh threshold voltage distributions 118, 120 (e.g., target data states). In these examples, the threshold voltage distributions after cycling 122, 124 have shifted or spread away from the fresh threshold voltage distributions 118, 120. Different kinds of unselected sub-block disturb may occur. Erase disturb refers to unselected sub-block disturb that occurs when a selected sub-block is erased. Program disturb refers to unselected sub-block disturb that occurs when a selected sub-block is programmed. In FIG. 1B, erase disturb causes the fresh threshold voltage distribution 120 corresponding to the 0 state to downshift to the threshold voltage distribution after cycling 124. Program disturb causes the fresh threshold voltage distribution 118 corresponding to the 1 state to upshift to the threshold voltage distribution after cycling 122.

Unselected sub-block disturb can occur on any unselected sub-block. The examples of sub-block disturb 116 illustrated in FIG. 1B may occur on an unselected lower sub-block when operations (e.g., erase and/or program) are performed on a selected upper sub-block. Additionally or alternatively, the examples of sub-block disturb 116 illustrated in FIG. 1B may occur on an unselected upper sub-block when operations (e.g., erase and/or program) are performed on a selected lower sub-block.

Over time, unselected sub-block disturb can lead to an unrecoverable data failure. For example, data stored in an unselected sub-block can degrade to a point where the data is unrecoverable. As a countermeasure, data maintenance (e.g., refresh or restore) may be performed on an unselected sub-block in order to avoid an unrecoverable data failure. Embodiments described herein provide detection techniques for unselected sub-block disturb. For example, a disturb condition may be detected. A disturb condition is a state in which disturb satisfies one or more criteria for detection. For example, if disturb has caused a degree of threshold voltage distribution degradation, a disturb condition may have occurred and/or may be detected. In an embodiment, data maintenance (e.g., refresh or restore) may be performed in response to detecting the disturb condition. A memory die (e.g., NAND-type memory die) may perform a sub-block data refresh. Additionally or alternatively, a controller may perform a sub-block data refresh.

Figure 1C:
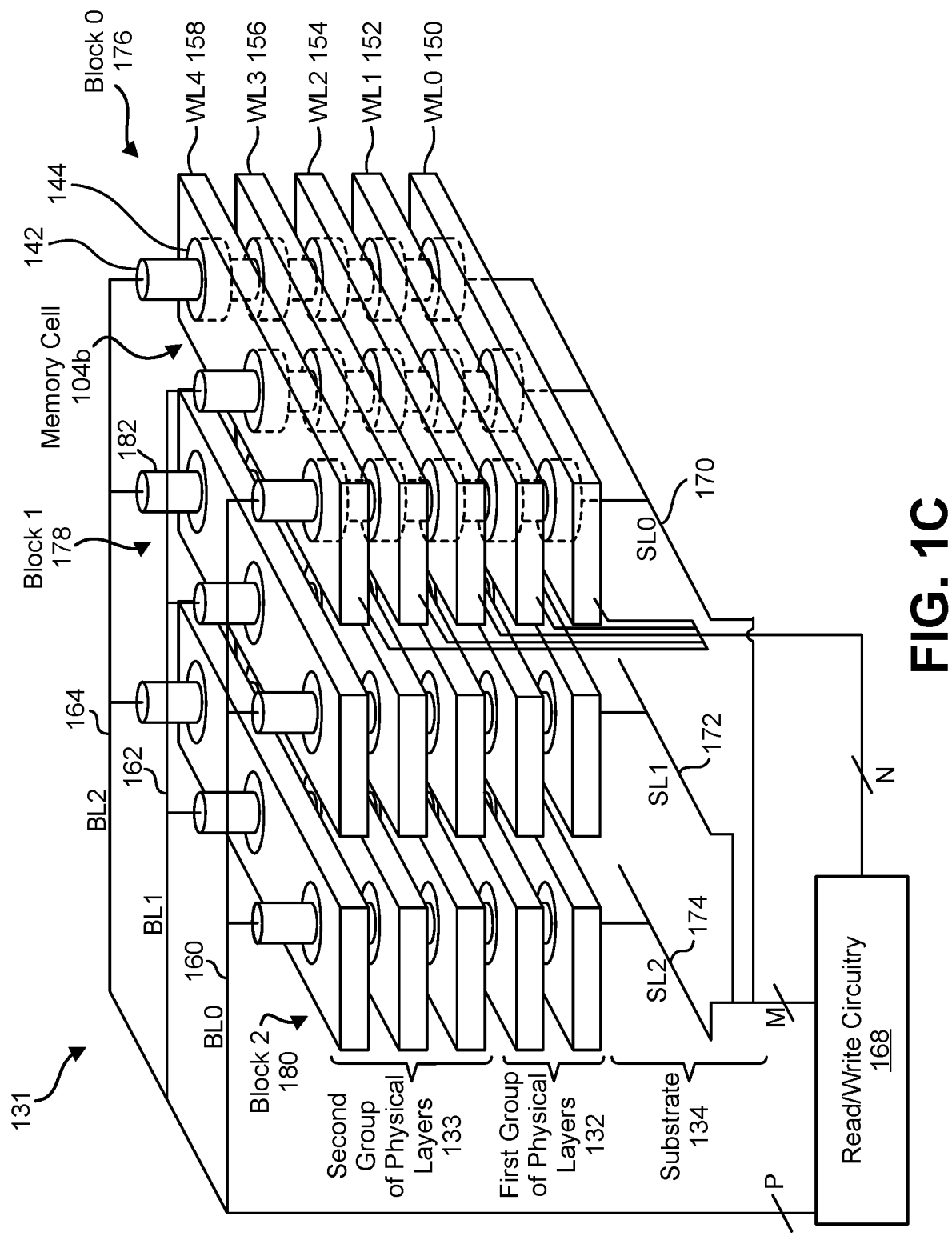
FIG. 1C is a diagram illustrating an embodiment of a 3D memory in a NAND configuration.

FIG. 1C illustrates an embodiment of a 3D memory 131 in a NAND flash configuration. The 3D memory 131 includes multiple physical layers that are monolithically formed above a substrate 134, such as a silicon substrate. Storage elements (e.g., memory cells), such as a representative memory cell 104b, are arranged in arrays in the physical layers.

The representative memory cell 104b includes a charge trap structure 144 between a word line/control gate (WL4) 158 and a conductive channel 142. Charge may be injected into or drained from the charge trap structure 144 via biasing of the conductive channel 142 relative to the word line 158. For example, the charge trap structure 144 may include silicon nitride and may be separated from the word line 158 and the conductive channel 142 by a gate dielectric, such as a silicon oxide. An amount of charge in the charge trap structure 144 affects an amount of current through the conductive channel 142 during a read operation of the memory cell 104b and indicates one or more bit values that are stored in the memory cell 104b.

The 3D memory 131 includes multiple erase blocks, including a first block (block 0) 176, a second block (block 1) 178, and a third block (block 2) 180. Each block 176-180 includes a "vertical slice" of the physical layers that includes a stack of word lines, illustrated as a first word line (WL0) 150, a second word line (WL1) 152, a third word line (WL2) 154, a fourth word line (WL3) 156, and the fifth word line (WL4) 158. Multiple conductive channels (having a substantially vertical orientation with respect to FIG. 1C) extend through the stack of word lines. Each conductive channel is coupled to a storage element in each word line 150-158, forming a NAND string of storage elements. FIG. 1C illustrates three blocks 176-180, five word lines 150-158 in each block, and three conductive channels in each block for clarity of illustration. However, the 3D memory 131 may have more than three blocks, more than five word lines per block, and more than three conductive channels per block.

Read/write circuitry 168 is coupled to the conductive channels via multiple conductive lines, illustrated as a first bit line (BL0) 160, a second bit line (BL1) 162, and a third bit line (BL2) 164 at a first end of the conducive channels (e.g., an end most remote from the substrate 134) and a first source line (SL0) 170, a second source line (SL1) 172, and a third source line (SL2) 174) at a second end of the conductive channels (e.g., an end nearer to or within the substrate 134). The read/write circuitry 168 is illustrated as coupled to the bit lines 160-164 via "P" control lines, coupled to the source lines 170-174 via "M" control lines, and coupled to the word lines 150-158 via "N" control lines.

Each of P, M, and N may have a positive integer value based on the specific configuration of the 3D memory 131. In one example, P=3, M=3, and N=5.

In a particular embodiment, each of the bit lines and each of the source lines may be coupled to the same end (e.g., the first end or the second end) of different conductive channels. For example, a particular bit line may be coupled to a first end of a conductive channel 182 and a particular source line may be coupled to a first end of the conductive channel 142. A second end of the conductive channel 182 may be coupled (e.g., electrically coupled) to a second end of the conductive channel 142. Accordingly, the conductive channel 182 and the conductive channel 142 may be coupled in series and may be coupled to the particular bit line and the particular source line.

Although each of the conductive channels, such as the conductive channels 142, 182, is illustrated as a single conductive channel, each of the conductive channels may include multiple conductive channels that are in a stack configuration. The multiple conductive channels in a stacked configuration may be coupled by one or more connectors. Additionally, an etch stop layer (not illustrated in FIG. 1C) having a conductive connector coupled to physically proximate portions of a conductive channel may be included in the multiple conductive channels, such as between the first group of physical layers 132 and the second group of physical layers 133. Additionally or alternatively, one or more sub-block gate transistors (not illustrated in FIG. 1C) may be coupled between the first group of physical layers 132 and the second group of physical layers 133 as illustrated in FIG. 1A.

In an embodiment, the first group of physical layers 132 is an example of a first sub-block 102 and the second group of physical layers 133 is an example of a second sub-block. For example, each sub-block (e.g., "word line-based" sub-blocks) may include memory cells corresponding to a subset of word lines 150-158. In an alternative embodiment, each sub-block (e.g., "string-based" sub-blocks) may include memory cells corresponding to a subset of strings (e.g., NAND strings), and may have, for example, common source lines, but not common bit lines.

The read/write circuitry 168 facilitates and/or effectuates read and write operations performed on the NAND memory 131. For example, data may be stored to storage elements coupled to the word line 158 and the read/write circuitry 168 may read bit values from the storage elements. As another example, the read/write circuitry 168 may apply selection signals to control lines coupled to the word lines 150-158, the bit lines 160-164, and the source lines 140-172 to cause a programming voltage (e.g., a voltage pulse or series of voltage pulses) to be applied across selected storage element(s) of the selected word line (e.g., the fourth word line 158).

During a read operation, a controller (such as the controller 238 illustrated in FIG. 2) may receive a request from a host device, such as a computer, smartphone, or laptop computer. The controller may cause the read/write circuitry 168 to read bits from particular storage elements of the 3D memory 131 by applying appropriate signals to the control lines to cause storage elements of a selected word line to be sensed. Accordingly, the 3D memory 131 having multiple conductive channels in a stacked configuration may be configured to read from and write data to one or more storage elements.

One or more of sub-blocks of memory cells 104 in an array of memory cells 104 may be coupled by a channel (e.g., a physical communication channel) as illustrated, for example, in FIGS. 1A and 1C. In an embodiment, the channel comprises a bit line and/or a source line.

Figure 2:
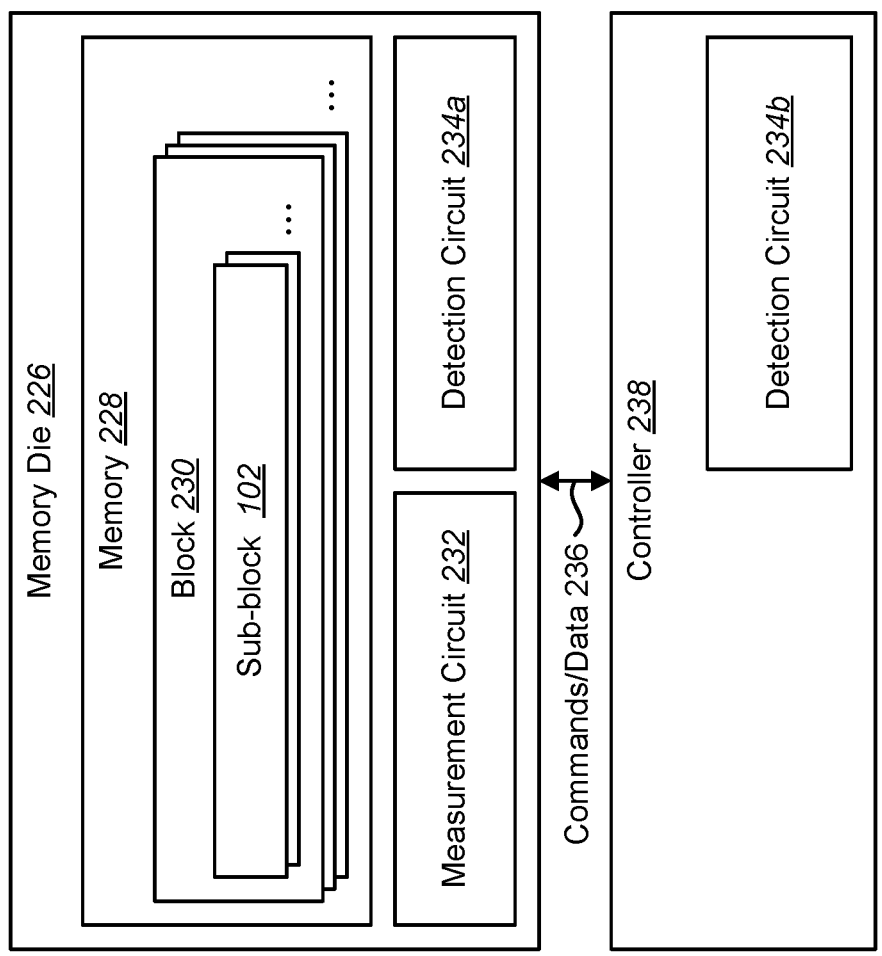
FIG. 2 is a block diagram illustrating one embodiment of a memory die and a controller.

FIG. 2 is a block diagram illustrating one embodiment of a memory die 226 and a controller 238. While one memory die 226 is illustrated in FIG. 2, one or more memory die 226 (e.g., one memory die, two memory die, eight memory die, or another number of memory die) may interface with a single controller 238.

The memory die 226 includes a memory 228, such as a non-volatile memory of storage elements. For example, the memory 228 includes a flash memory (e.g., NAND or NOR), PCM, ReRAM, MRAM, F-RAM, holographic memory, and/or any other type of non-volatile memory (NVM). The memory 228 may have a three-dimensional (3D) memory structure. As an example, the memory 228 has a 3D vertical bit line (VBL) configuration. In an implementation, the memory 228 is a non-volatile memory having a 3D memory configuration that is monolithically formed in one or more physical levels of arrays of memory cells having an active area disposed above a silicon substrate. Alternatively, the memory 228 has another configuration, such as a two-dimensional (2D) memory configuration or a non-monolithic 3D memory configuration (e.g., a stacked die 3D memory configuration).

The controller 238 is configured to send data and/or commands 236 to the memory die 226 and to receive data 236 from the memory die 226. For example, the controller 238 is configured to send data and a program command to cause the memory die 226 to store data to a specified address of the memory 228. In an embodiment, the controller 238 is also configured to send data and/or commands 236 to the memory 228 associated with background scanning operations, garbage collection operations, and/or wear leveling operations, as illustrative, non-limiting examples. The controller 238 is configured to send a read command to the memory die 226 to access data from a specified address of the memory 228. In an embodiment, the controller 238 is separate from the memory die 226 as illustrated in FIG. 2. In another embodiment, the controller 238 is included in the memory die 226.

In an embodiment, the controller 238 is a system-level controller that manages one or more memory die 226. For example, the controller 238 receives read requests from a host and services the read request by sending the requested data back to the host. A read request is a command from the host that includes an address for the desired data and either a predefined quantity of the data requested or a variable quantity of requested data. The controller 238 interprets that read request and reads data from one or more of the memory die 226.

In an embodiment, the memory 228 includes one or more blocks 230. A block 230 of memory 228 includes storage elements (e.g., memory cells). The storage elements are arranged according to word lines and bit lines. An example of a block 230 is a NAND flash erase block of storage elements. Each storage element of the memory 228 is programmable to a state (e.g., a threshold voltage in a flash configuration or a resistive state in a resistive memory configuration) that indicates or corresponds to one or more values. Each block 230 of the memory 228 includes one or more word lines. Each word line includes one or more pages, such as one or more physical pages and/or logical pages. In one embodiment, each page is configured to store a codeword. A word line is configurable to operate as a single-level-cell (SLC) word line, as a multi-level-cell (MLC) word line, or as a tri-level-cell (TLC) word line, as illustrative, non-limiting examples.

Each block 230 of memory 228 includes two or more sub-blocks 102. Each sub-block 102 includes a subset of memory cells of the block 230. In an embodiment, a sub-block includes memory cells corresponding to a subset of word lines of the block 230. For example, a lower sub-block 102 includes 48 word lines and an upper sub-block 102 includes 48 word lines as described in connection with FIG. 1A. Other numbers of word lines may be implemented in a sub-block 102.

In an embodiment, each memory die 226 includes other circuitry. For example, a memory die 226 includes a measurement circuit 232. The measurement circuit 232 is configured to take measurements of the memory 228 (e.g., of one or more of the sub-blocks 102). In an embodiment, a "measurement" is information indicating whether one or more memory cells are activated at a measurement voltage (e.g., sense voltage or read voltage), information indicating a number of activated memory cells at a measurement voltage, information indicating one or more data states of one or more memory cells, and the like. In an embodiment, a measurement may be utilized to determine a number of errors. For example, data states may be read based on one or more measurement(s) and/or an error rate (e.g., fail bit count (FBC) per 1 kilobyte (kB) of data, number of errors per sector) may be determined based on one or more measurement(s). The measurement circuit 232 applies one or more measurement voltages (e.g., sense voltages or read voltages) to one or more word lines of the memory 228 and measures one or more bit lines to determine a state (e.g., threshold voltage) of one or more memory cells. In an embodiment, the measurement circuit 232 is included in read/write circuitry and/or is read/write circuitry.

In an embodiment, the measurement circuit 232 takes one or more measurements from one or more word lines of a sub-block 102. In an example, the measurement circuit 232 takes measurements from all word lines in the sub-block 102. If a disturb condition is detected for at least one of all the word lines, the entire sub-block 102 may be refreshed. In another example, the measurement circuit 232 may take one or more measurements from only one word line or a number (e.g., subset) of word lines in the sub-block 102 that are sensitive (e.g., most sensitive) to disturb. If the measurement(s) of the subset of word lines does not indicate a disturb condition, it may, in various embodiments, be assumed that the remainder of the word lines in the sub-block 102 are not in a disturb condition. In an embodiment, the word lines that are sensitive to disturb may include one or more lowest word lines in each sub-block 102 and/or one or more highest word lines in each sub-block. Higher voltage may occur at lower word lines. In an embodiment, the measurement(s) may additionally or alternatively be taken from one or more buffers between sub-blocks.

In an embodiment, the measurement circuit 232 takes one or more measurements at one or more offset thresholds. An "offset threshold" is a measurement voltage (e.g., sense voltage or read voltage) that is offset relative to a read threshold, offset relative to a target data state, and/or that corresponds to a target data state (e.g., a target data state tail). For example, an offset threshold is offset by an amount of voltage relative to a read threshold or relative to a target data state. In an embodiment, a first offset threshold is offset below a read threshold and a second offset threshold is offset above a read threshold. In an example of SLC, a first offset threshold is offset by −0.3 volts (V) below the read threshold and a second offset threshold is offset by +0.3 V above the read threshold. In an example of MLC, a first offset threshold is offset by −0.2 V below a first read threshold and a second offset threshold is offset by +0.2 V above a second read threshold. In an example of TLC, a first offset threshold is offset by −0.1 V below a first read threshold and a second offset threshold is offset by +0.1 V above a second read threshold. It should be noted that offset amounts can be different in other examples (e.g., ±0.05 V for TLC). In an embodiment, a first offset threshold is offset above a tail of a first target data state and a second offset threshold is offset below a tail of a second target data state. In an embodiment, two offset thresholds may be between two target data states. In an embodiment, offset thresholds may be separated by one or more target data states. In an embodiment, offset thresholds may be offset relative to different read thresholds or different target data states. In an embodiment, each offset threshold is associated with a different target data state. One, two, three, four, or more offset thresholds may be utilized. Examples of offset thresholds are described in connection with FIGS. 5A-C, 6A-C, 8A-C, 9A-C, and 10. A "read threshold" is a voltage at which data is sensed during a read operation (e.g., a normal read operation).

An embodiment of SLC has two target data states and one read threshold or read level. In SLC, an example of the read threshold is approximately 3 V (e.g., 3 volts are applied to the control gate of a transistor in the pertinent memory cell). An embodiment of MLC has four target data states (denoted "Er" for erase, "A," "B," and "C") and three read thresholds or read levels between adjacent target data states. In MLC, examples of the read thresholds include approximately 1 V (between Er and A), 2.5 V (between A and B), and 4 V (between B and C). An embodiment of TLC has eight target data states (denoted "Er" for erase, "A," "B," "C," "D," "E," "F," and "G") and seven read thresholds or read levels between adjacent states. In TLC, examples of the read thresholds include approximately 0.5 V (between Er and A), 1.4 V (between A and B), 2.1 V (between B and C), 3.0 V (between C and D), 3.7 V (between D and E), 4.6 V (between E and F), and 5.6 V (between F and G).

A detection circuit 234 is configured to detect a disturb condition based on the one or more measurements provided by the measurement circuit 232. For example, the detection circuit 234 detects the disturb condition based on at least one of a first measurement or a second measurement. In an embodiment, the detection circuit 234a is included in the memory die 226. In another embodiment, the detection circuit 234b is included in the controller 238.

In an embodiment, the detection circuit 234 detects the disturb condition based on a cell count within at least one range between offset thresholds. For example, the detection circuit 234 (e.g., detection circuit 234a or detection circuit 234b) utilizes a first measurement at a first offset threshold and a second measurement at a second offset threshold to determine the cell count within a range between the first offset threshold and the second offset threshold. In an embodiment, the detection circuit 234 determines the cell count by subtracting a number of memory cells of the first measurement from a number of memory cells of the second measurement. In an embodiment, the detection circuit 234 determines the cell count based on multiple ranges between sets of offset thresholds. For example, the cell count is a sum of cells within multiple ranges.

In an embodiment, the detection circuit 234 detects the disturb condition by comparing the cell count to a threshold. If the cell count satisfies the threshold, a disturb condition is detected. More detailed examples of detecting a disturb condition based on a cell count are given in connection with FIGS. 4, 5A-C, and 6A-C.

In an embodiment, the detection circuit 234 detects the disturb condition based on checking one or more measurements. In an example, the controller 238 (e.g., detection circuit 234b) performs error checking based on one or more measurements. Examples of error checking include error checking based on error correction coding (ECC), low-density parity check (LDPC) codes, and/or Bose-Chaudhuri-Hocquenghem (BCH) codes. In an embodiment, the controller 238 receives data 236 based on the measurement(s) at one or more offset thresholds. A check failure of one or more measurements indicates the disturb condition. In an embodiment, a check failure occurs when error checking indicates an error in the data (e.g., any error, a degree of error, or an unrecoverable error). Examples of detecting a disturb condition based on error checking are given in connection with FIGS. 7, 8A-C, 9A-C, and 10.

In an embodiment, the detection circuit 234 determines an error rate (e.g., FBC per 1 kB of data or number of errors per sectors). In an embodiment, a disturb condition is detected (e.g., a cell count threshold is satisfied, a check failure occurs, and/or a read failure occurs) when the error rate satisfies a threshold. For instance, the error rate may be an example of the cell count described herein and/or may be an example of a value for determining check pass/fail or read pass/fail. Examples of ECC capability for TLC or MLC include BCH ECC (which can correct up to approximately 60 bits per 1 kB, for example) and LDPC ECC (which can correct up to approximately 120 bits per 1 kB, for example). In an embodiment, a disturb condition is detected if the error rate is greater than 100 bits per 1 kB, which may trigger data maintenance. In another embodiment, a disturb condition is detected if the error rate is greater than 60 bits per 1 kB, which may trigger data maintenance. An example of ECC capability for SLC includes ECC that can correct up to approximately 20 bits per 1 kB. In an embodiment, a disturb condition is detected if the error rate is greater than 20 bits per 1 kB, which may trigger data maintenance. In another embodiment, a check failure or read failure occurs if the error rate is greater than 10 bits per 1 kB, which may trigger data maintenance.

In an embodiment, the detection circuit 234 initiates data maintenance (e.g., refresh or restore) in response to the disturb condition. In an example, the detection circuit 234 sets a refresh or recovery flag for a refresh or recovery to be performed on the unselected sub-block where the disturb condition has occurred. In an example, the detection circuit 234a on the memory die 226 sends a notification to the controller 238 indicating the disturb condition. The controller 238 may respond by performing data maintenance.

In an example, the measurement circuit 232 is configured to take a first measurement of a sub-block 102 of memory cells at a first offset threshold and a second measurement of the sub-block 102 of memory cells at a second offset threshold.

In accordance with some of the techniques described herein, disturb condition detection may be performed with negligible performance overhead. For example, a disturb condition may be detected by using two offset measurements or reads before sub-block erase. In an example, an erase operation takes about 5 milliseconds (ms) to perform, while detection with two offset measurements or reads takes about 60 microseconds (μs). Accordingly, the performance overhead is about 1%, which can be considered negligible.

Figure 3:
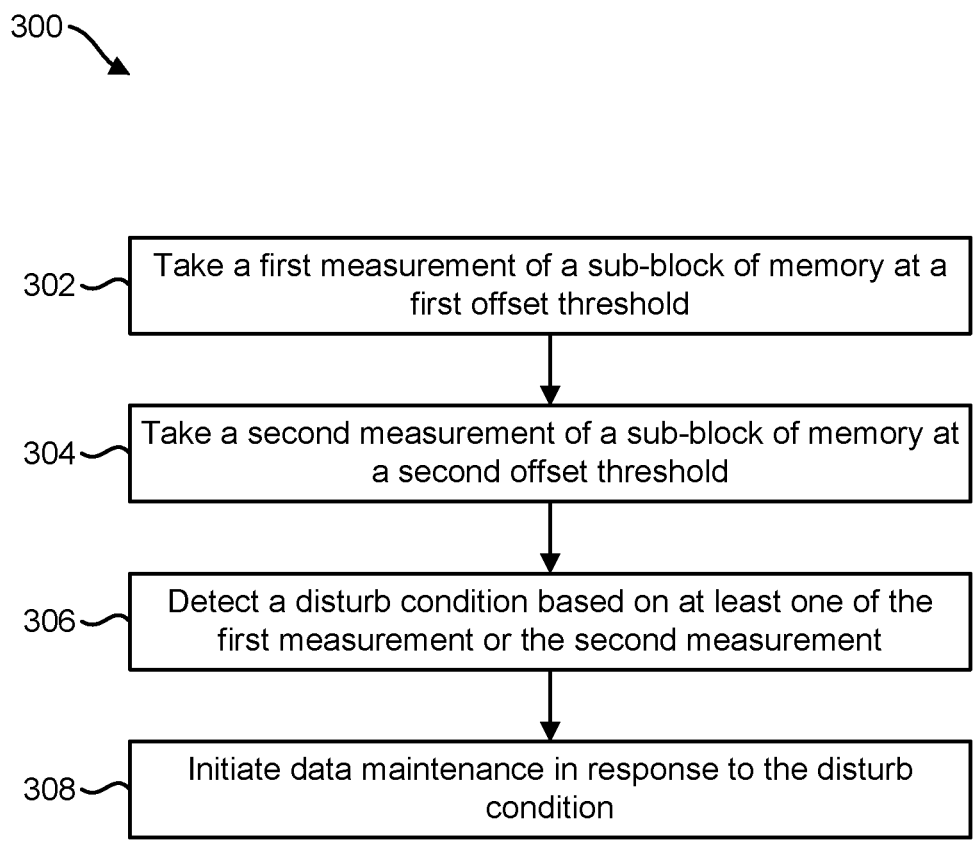
FIG. 3 is a flow diagram illustrating an example of a method of memory disturb detection.

FIG. 3 is a flow diagram illustrating an example of a method 300 of memory disturb detection. In an embodiment, circuitry (e.g., a measurement circuit 232 and a detection circuit 234) performs the method 300. In an embodiment, a non-volatile storage device performs the method 300.

A measurement circuit 232 takes 302 a first measurement of a sub-block 102 of memory 228 at a first offset threshold. This is accomplished as described in connection with FIG. 2. For example, the measurement circuit 232 measures an unselected sub-block 102 at a first offset threshold.

The measurement circuit 232 takes 304 a second measurement of the sub-block 102 of memory 228 at a second offset threshold. This is accomplished as described in connection with FIG. 2. For example, the measurement circuit 232 measures an unselected sub-block 102 at a second offset threshold.

A detection circuit 234 detects 306 a disturb condition based on at least one of the first measurement or the second measurement. This is accomplished as described in connection with FIG. 2. In an embodiment, the detection circuit 234 detects the disturb condition based on a cell count in at least one range based on the first measurement and the second measurement (e.g., between the first offset threshold and the second offset threshold). In an embodiment, the detection circuit 234 detects the disturb condition based on a check failure.

The detection circuit 234 initiates 308 data maintenance in response to the disturb condition. This is accomplished as described in connection with FIG. 2. In an embodiment, the detection circuit 234 sets a refresh or recovery flag. In an embodiment, the detection circuit 234a sends a notification to the controller 238 indicating the disturb condition.

Figure 4:
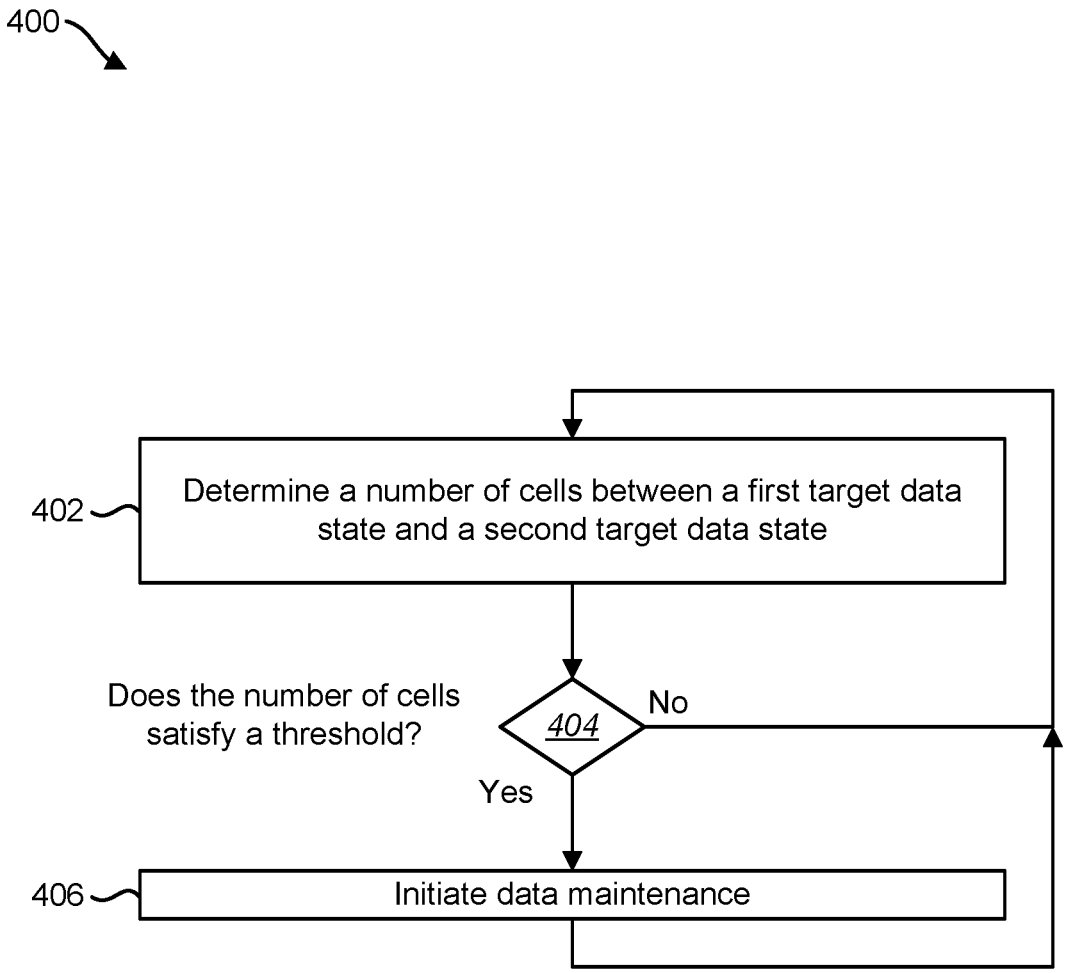
FIG. 4 is a flow diagram illustrating another example of a method of memory disturb detection.

FIG. 4 is a flow diagram illustrating another example of a method 400 of memory disturb detection. In an embodiment, a maintenance circuit performs the method 400. A maintenance circuit is a circuit configured to detect a disturb condition and/or initiate data maintenance (e.g., refresh or restore). For example, the memory die 226 and/or controller 238 may include a maintenance circuit instead of the detection circuit 234. The maintenance circuit is configured to maintain stored data in the memory 228 (e.g., block(s) 230 and/or sub-block(s) 102). For example, the maintenance circuit detects degradation of stored data and initiates one or more operations to maintain the stored data. In an embodiment, the maintenance circuit may perform one or more of the operations described in connection with the detection circuit 234.

The maintenance circuit determines 402 a number of memory cells of an unselected sub-block between a first target data state and a second target data state. This is accomplished as described in connection with FIG. 2. For example, a first offset threshold may correspond to a tail of a first target data state (and/or may be offset from a read voltage) and a second offset threshold may correspond to a tail of a second target data state (and/or may be offset from the read voltage). The maintenance circuit utilizes measurements from the first offset threshold and the second offset threshold to determine the number of cells between the first target data state and the second target data state. In an embodiment, the maintenance circuit determines 402 the number of memory cells as a difference between a first number of memory cells corresponding to the first offset threshold (e.g., a first measurement) and a second number of memory cells corresponding to the second offset threshold (e.g., a second measurement). For example, the maintenance circuit includes calculation circuitry configured to calculate a difference between the first number of memory cells and the second number of memory cells. In an embodiment, the maintenance circuit determines 402 the number of memory cells between the first target data state and the second target data state for an unselected sub-block in response to an operation (e.g., erase, program, and/or read) for a selected sub-block.

The maintenance circuit determines 404 whether the number of cells satisfies a threshold. This is accomplished as described in connection with FIG. 2. In an embodiment, the maintenance circuit compares the number of cells to a threshold. In a case that the number of cells does not satisfy the threshold, no disturb condition is detected. In an embodiment, operation returns to determining 402 the number of cells between the first target data state and the second target data state for an unselected sub-block in response to an operation (e.g., erase, program, and/or read) on a selected sub-block.

In a case that the number of cells satisfies the threshold, a disturb condition of the unselected sub-block is detected. In response to the disturb condition being detected (e.g., the number of cells satisfying the threshold), the maintenance circuit initiates 406 data maintenance. This is accomplished as described in connection with FIG. 2. In an embodiment, the maintenance circuit sets a data maintenance (e.g., refresh or recovery) flag. In an embodiment, the maintenance circuit sends a notification to the controller 238 indicating the disturb condition. The notification causes the controller 238 to perform data maintenance. In an embodiment, operation returns to determining 402 the number of cells between the first target data state and the second target data state for an unselected sub-block in response to an operation (e.g., erase, program, and/or read) on a selected sub-block.

FIG. 5A is a diagram illustrating an example of target data states 541a-b and offset thresholds 540a-b. In particular, FIG. 5A illustrates a plot with number of cells on the vertical axis and threshold voltage (Vt) on the horizontal axis. In an embodiment, the plot corresponds to SLC memory with two-offset erase/program disturb detection for a sub-block 102 and/or single word line.

In this example, a read threshold 544 (e.g., a read threshold for a normal read operation) is illustrated between the first target data state 541a and the second target data state 541b. In an embodiment, a first offset threshold 540a is offset relative to (e.g., −0.3 V below) the read threshold 544 (e.g., 3 V) and a second offset threshold 540b is offset relative to (e.g., 0.3 V above) the read threshold 544. In another embodiment, the first offset threshold 540a is offset relative to the first target data state 541a (e.g., at or above the upper tail of the first target data state 541a) and the second offset threshold 540b is offset relative to the second target data state 541b (e.g., at or below the second target data state 541b). In an embodiment, the first offset threshold 540a is associated with the first target data state 541a and the second offset threshold 540b is associated with the second target data state 541b. In the example of FIG. 5A, the first target data state 541a is adjacent to the second target data state 541b (e.g., without any other intervening target data state).

As illustrated in FIG. 5A, a range 542 exists between the first offset threshold 540a and the second offset threshold 540b. In an embodiment, the measurement circuit 232 takes a first measurement at the first offset threshold 540a and a second measurement at the second offset threshold 540b. The detection circuit 234 determines a cell count within the range 542 (e.g., between the first offset threshold 540a and the second offset threshold 540b) based on the first measurement and the second measurement. In an embodiment, the first measurement indicates a number of cells below the first offset threshold 540a and the second measurement indicates a number of cells below the second offset threshold 540b. In an embodiment, the detection circuit 234 determines a cell count within the range 542 by subtracting the number of cells below the first offset threshold 540*a* from the number of cells below the second offset threshold 540*b*. The detection circuit 234 compares the cell count to a threshold to determine whether a disturb condition exists. In a case that the cell count does not satisfy the threshold (e.g., is less than or equal to the threshold), then data maintenance (e.g., refresh) may not be needed (e.g., no significant disturb has occurred). In a case that the cell count satisfies the threshold (e.g., is greater than the threshold), then data maintenance (e.g., refresh) may be performed (e.g., significant disturb has occurred).

FIG. 5B is a diagram illustrating an example of unselected sub-block program disturb 545. In particular, FIG. 5B illustrates a plot with number of cells on the vertical axis and threshold voltage (Vt) on the horizontal axis. A first fresh threshold voltage distribution corresponding to the first target data state 541*a* is illustrated and a second fresh threshold voltage distribution corresponding to the second target data state 541*b* is illustrated. A first threshold voltage distribution after cycling and a second threshold voltage distribution after cycling are also illustrated. The unselected sub-block program disturb 545 causes some cells corresponding to the first threshold voltage distribution to increase in threshold voltage.

In an embodiment, the measurement circuit 232 takes a first measurement at the first offset threshold 540*a* and a second measurement at the second offset threshold 540*b* as described above. The detection circuit 234 determines a cell count (e.g., a number of cells) within the range 542 (e.g., between the first offset threshold 540*a* and the second offset threshold 540*b*) based on the first measurement and the second measurement as described above. The detection circuit 234 compares the cell count to a threshold to determine whether a disturb condition exists. In the example illustrated in FIG. 5B, because the cell count satisfies the threshold (e.g., the cell count is greater than a disturb detection threshold N), the detection circuit 234 detects a disturb condition. Accordingly, the detection circuit 234 initiates data maintenance (e.g., sets a refresh flag or sends a notification) for the unselected sub-block. For example, the controller 238 commands a refresh of the data in the unselected sub-block in response to the detected disturb condition.

FIG. 5C is a diagram illustrating an example of unselected sub-block erase disturb 546. In particular, FIG. 5B illustrates a plot with number of cells on the vertical axis and threshold voltage (Vt) on the horizontal axis. A first fresh threshold voltage distribution corresponding to the first target data state 541*a* is illustrated and a second fresh threshold voltage distribution corresponding to the second target data state 541*b* is illustrated. A first threshold voltage distribution after cycling and a second threshold voltage distribution after cycling are also illustrated. The unselected sub-block erase disturb 546 causes some cells corresponding to the second threshold voltage distribution to decrease in threshold voltage.

In an embodiment, the measurement circuit 232 takes a first measurement at the first offset threshold 540*a* and a second measurement at the second offset threshold 540*b* as described above. The detection circuit 234 determines a cell count (e.g., a number of cells) within the range 542 (e.g., between the first offset threshold 540*a* and the second offset threshold 540*b*) based on the first measurement and the second measurement as described above. The detection circuit 234 compares the cell count to a threshold to determine whether a disturb condition exists. In the example illustrated in FIG. 5C, because the cell count satisfies the threshold (e.g., the cell count is greater than a disturb detection threshold N), the detection circuit 234 detects a disturb condition. Accordingly, the detection circuit 234 initiates data maintenance (e.g., sets a refresh flag or sends a notification) for the unselected sub-block. For example, the controller 238 commands a refresh of the data in the unselected sub-block in response to the detected disturb condition.

FIG. 6A is a diagram illustrating another example of target data states 641*a*-*h* and offset thresholds 640*a*-*d*. In particular, FIG. 6A illustrates a plot with number of cells on the vertical axis and threshold voltage (Vt) on the horizontal axis. In an embodiment, the plot corresponds to TLC memory with two-offset erase/program disturb detection for a sub-block 102 and/or single word line.

In this example, a read threshold (e.g., a read threshold for a normal read operation, not illustrated in FIG. 6A) is located between the first target data state 641*a* and the second target data state 641*b*. In an embodiment, a first offset threshold 640*a* is offset relative to (e.g., −0.1 V below) the read threshold (e.g., 0.5 V) and a second offset threshold 640*b* is offset relative to (e.g., +0.1 V above) the read threshold. In another embodiment, the first offset threshold 640*a* is offset relative to the first target data state 641*a* (e.g., at or above the upper tail of the first target data state 641*a*) and the second offset threshold 640*b* is offset relative to the second target data state 641*b* (e.g., at or below the second target data state 641*b*). In an embodiment, the first offset threshold 640*a* is associated with the first target data state 641*a* and the second offset threshold 640*b* is associated with the second target data state 641*b*. In the example of FIG. 6A, the first target data state 641*a* is adjacent to the second target data state 641*b* (e.g., without any other intervening target data state).

In this example, a second read threshold (e.g., a read threshold for a normal read operation, not illustrated in FIG. 6A) is located between a third target data state 641*g* and a fourth target data state 641*h*. In an embodiment, a third offset threshold 640*c* is offset relative to (e.g., −0.1 V below) the second read threshold (e.g., 5.6 V) and a fourth offset threshold 640*d* is offset relative to (e.g., +0.1 V above) the second read threshold. In another embodiment, the third offset threshold 640*c* is offset relative to the third target data state 641*g* (e.g., at or above the upper tail of the third target data state 641*g*) and the fourth offset threshold 640*d* is offset relative to the fourth target data state 641*h* (e.g., at or below the fourth target data state 641*h*). In an embodiment, the third offset threshold 640*c* is associated with the third target data state 641*g* and the fourth offset threshold 640*d* is associated with the fourth target data state 641*h*. In the example of FIG. 6A, the third target data state 641*g* is adjacent to the fourth target data state 641*h* (e.g., without any other intervening target data state). Additionally, the third target data state 641*g* is non-adjacent to the second target data state 641*b* (e.g., the third target data state 641*g* is separated from the second target data state 641*b* by one or more target data states 641*c*-*g*). Additionally, the third offset threshold 640*c* is separated from the second offset threshold 640*b* by one or more target data states 641*b*-*g*.

As illustrated in FIG. 6A, a first range 642*a* exists between the first offset threshold 640*a* and the second offset threshold 640*b*. In an embodiment, the measurement circuit 232 takes a first measurement at the first offset threshold 640*a* and a second measurement at the second offset threshold 640*b*. The detection circuit 234 determines a first cell count within the first range 642*a* (e.g., between the first offset threshold 640*a* and the second offset threshold 640*b*) based on the first measurement and the second measurement. In an embodiment, the first measurement indicates a number of cells below the first offset threshold 640*a* and the second measurement indicates a number of cells below the second offset threshold 640*b*. In an embodiment, the detection circuit 234 determines a first cell count within the first range 642*a* by subtracting the number of cells below the first offset threshold 640*a* from the number of cells below the second offset threshold 640*b*.

As illustrated in FIG. 6A, a second range 642*b* exists between the third offset threshold 640*c* and the fourth offset threshold 640*d*. In an embodiment, the measurement circuit 232 takes a third measurement at the third offset threshold 640*c* and a fourth measurement at the fourth offset threshold 640*d*. The detection circuit 234 determines a second cell count within the second range 642*b* (e.g., between the third offset threshold 640*c* and the fourth offset threshold 640*d*) based on the third measurement and the fourth measurement. In an embodiment, the third measurement indicates a number of cells below the third offset threshold 640*c* and the fourth measurement indicates a number of cells below the fourth offset threshold 640*d*. In an embodiment, the detection circuit 234 determines a second cell count within the second range 642*b* by subtracting the number of cells below the third offset threshold 640*c* from the number of cells below the fourth offset threshold 640*d*.

In an embodiment, the detection circuit 234 determines a (total) cell count by adding the first cell count and the second cell count. The detection circuit 234 compares the (total) cell count to a threshold to determine whether a disturb condition exists. In a case that the cell count does not satisfy the threshold (e.g., is less than or equal to the threshold), then data maintenance (e.g., refresh or restore) may not be needed (e.g., no significant disturb has occurred). In a case that the cell count satisfies the threshold (e.g., is greater than the threshold), then data maintenance (e.g., refresh or restore) may be performed (e.g., significant disturb has occurred).

In an embodiment, the detection circuit 234 compares the first cell count to a first threshold (e.g., to detect program disturb) and/or compares the second cell count to a second threshold (e.g., to detect erase disturb) to determine whether a disturb condition exists. In a case that the first cell count does not satisfy the first threshold and/or the second cell count does not satisfy the second threshold, then data maintenance (e.g., refresh) may not be needed (e.g., no significant disturb has occurred). In a case that the first cell count satisfies the first threshold (e.g., is greater than the threshold), and/or that the second cell count satisfies the second threshold, then data maintenance (e.g., refresh) may be performed (e.g., significant disturb has occurred). In an embodiment, the memory die 226 includes a read/write circuit configured to send a compensating erase pulse in response to the detection circuit 234 detecting program disturb. A compensating erase pulse is an erase pulse for correcting the shift in threshold voltage due to program disturb. For example, a compensating erase pulse has lower amplitude in comparison with a normal erase pulse in order to shift the threshold voltage downward by an amount without completely erasing a cell. In an embodiment, the memory die 226 includes a read/write circuit configured to send a compensating program pulse in response to the detection circuit 234 detecting erase disturb. A compensating program pulse is a program pulse for correcting the shift in threshold voltage due to erase disturb. For example, a compensating program pulse has lower amplitude in comparison with a normal program pulse in order to shift the threshold voltage upward by an amount without overprogramming a cell (i.e., without increasing a threshold voltage of one or more cells beyond a target threshold voltage level).

FIG. 6B is a diagram illustrating another example of unselected sub-block program disturb 645. In particular, FIG. 6B illustrates a plot with number of cells on the vertical axis and threshold voltage (Vt) on the horizontal axis. A first fresh threshold voltage distribution corresponding to the first target data state 641*a* is illustrated and a second fresh threshold voltage distribution corresponding to the second target data state 641*b* is illustrated. A first threshold voltage distribution after cycling and a second threshold voltage distribution after cycling are also illustrated. The unselected sub-block program disturb 645 causes some cells corresponding to the first threshold voltage distribution to increase in threshold voltage. For example, a number of cells of the first threshold voltage distribution enters the first range 642*a* (e.g., the upper tail shifts) over a number of programming cycles.

In an embodiment, the measurement circuit 232 takes a first measurement at the first offset threshold 640*a* and a second measurement at the second offset threshold 640*b* as described above. The detection circuit 234 determines a first cell count (e.g., a number of cells) within the first range 642*a* (e.g., between the first offset threshold 640*a* and the second offset threshold 640*b*) based on the first measurement and the second measurement, as described above.

In an embodiment, the measurement circuit 232 takes a third measurement at the third offset threshold 640*c* and a fourth measurement at the fourth offset threshold 640*d* as described above. The detection circuit 234 determines a second cell count (e.g., a number of cells) within the second range 642*b* (e.g., between the third offset threshold 640*c* and the fourth offset threshold 640*d*) based on the third measurement and the fourth measurement, as described above.

In an embodiment, the detection circuit 234 adds the first cell count and a second cell count to determine a (total) cell count. The detection circuit 234 compares the (total) cell count to a threshold to determine whether a disturb condition exists. In the example illustrated in FIG. 6B, because the cell count satisfies the threshold (e.g., the cell count is greater than a disturb detection threshold N), the detection circuit 234 detects a disturb condition. Accordingly, the detection circuit 234 initiates data maintenance (e.g., sets a refresh flag or sends a notification) for the unselected sub-block. For example, the controller 238 commands a refresh of the data in the unselected sub-block in response to the detected disturb condition. In an embodiment, the detection circuit 234 compares the first cell count to a first threshold and/or compares the second cell count to a second threshold to determine whether a disturb condition exists. A disturb condition may exist if the first cell count satisfies the first threshold and/or if the second cell count satisfies a second threshold.

FIG. 6C is a diagram illustrating another example of unselected sub-block erase disturb 646. In particular, FIG. 6C illustrates a plot with number of cells on the vertical axis and threshold voltage (Vt) on the horizontal axis. A third fresh threshold voltage distribution corresponding to the third target data state 641*g* is illustrated and a fourth fresh threshold voltage distribution corresponding to the fourth target data state 641*h* is illustrated. A third threshold voltage distribution after cycling and a fourth threshold voltage distribution after cycling are also illustrated. The unselected sub-block erase disturb 646 causes some cells corresponding to the fourth threshold voltage distribution to decrease in threshold voltage. For example, a number of cells of the fourth threshold voltage distribution enters the second range 642b (e.g., the lower tail shifts) over a number of erases.

In an embodiment, the measurement circuit 232 takes a third measurement at the third offset threshold 640c and a fourth measurement at the fourth offset threshold 640d as described above. The detection circuit 234 determines a second cell count (e.g., a number of cells) within the second range 642b (e.g., between the third offset threshold 640c and the fourth offset threshold 640d) based on the third measurement and the fourth measurement as described above.

In an embodiment, the measurement circuit 232 takes a first measurement at the first offset threshold 640a and a second measurement at the second offset threshold 640b as described above. The detection circuit 234 determines a first cell count (e.g., a number of cells) within the first range 642a (e.g., between the first offset threshold 640a and the second offset threshold 640b) based on the first measurement and the second measurement as described above.

In an embodiment, the detection circuit 234 adds the first cell count and the second cell count to determine a (total) cell count. The detection circuit 234 compares the (total) cell count to a threshold to determine whether a disturb condition exists. In the example illustrated in FIG. 6C, because the cell count satisfies the threshold (e.g., the cell count is greater than a disturb detection threshold N), the detection circuit 234 detects a disturb condition. Accordingly, the detection circuit 234 initiates data maintenance (e.g., sets a refresh flag or sends a notification) for the unselected sub-block. For example, the controller 238 commands a refresh of the data in the unselected sub-block in response to the detected disturb condition. In an embodiment, the detection circuit 234 compares the first cell count to a first threshold and/or compares the second cell count to a second threshold to determine whether a disturb condition exists. A disturb condition may exist if the first cell count satisfies the first threshold and/or if the second cell count satisfies a second threshold.

FIG. 7 is a block diagram illustrating one embodiment of a non-volatile storage system 748 and a host 752. The non-volatile storage system 748 and the host 752 are coupled via a connection (e.g., a communication path), such as a bus or a wireless connection. The non-volatile storage system 748 includes an interface (e.g., an access device or host interface, not shown in FIG. 7) that enables communication via the communication path between the non-volatile storage system 748 and the host 752.

The non-volatile storage system 748 includes, or corresponds to, memory which may be included in, or distinct from (and accessible to), the host 752. For example, the non-volatile storage system 748 includes or corresponds to a non-volatile memory device, which is used as an embedded memory (e.g., a mobile embedded storage device), an enterprise storage drive (ESD), a client storage device, or a cloud storage device, as illustrative, non-limiting examples. In some implementations, the non-volatile storage system 748 is coupled to the host 752 indirectly, e.g., via a network. For example, the network includes a data center storage system network, an enterprise storage system network, a storage area network, a cloud storage network, a local area network (LAN), a wide area network (WAN), the Internet, and/or another network. In some implementations, the non-volatile storage system 748 is a network-attached storage (NAS) device or a component (e.g., a solid-state storage device) of a data center storage system, an enterprise storage system, or a storage area network.

In an embodiment, the non-volatile storage system 748 is embedded within the host 752, such as in accordance with a Joint Electron Devices Engineering Council (JEDEC) Solid State Technology Association Universal Flash Storage (UFS) configuration. For example, the non-volatile storage system 748 is configured to be coupled to the host 752 as embedded memory, such as eMMC® (trademark of JEDEC Solid State Technology Association, Arlington, Va.) and eSD, as illustrative examples. To illustrate, the non-volatile storage system 748 corresponds to an eMMC (embedded MultiMedia Card) device. As another example, the non-volatile storage system 748 corresponds to a memory card, such as a Secure Digital (SD®) card, a microSD® card, a mini SD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of Western Digital Corporation, San Jose, Calif.). Alternatively, the non-volatile storage system 748 is removable from the host 752 (i.e., "removably" coupled to the host 752). As an example, the non-volatile storage system 748 is removably coupled to the host 752 in accordance with a removable universal serial bus (USB) configuration.

In an embodiment, the non-volatile storage system 748 operates in compliance with an industry specification. For example, the non-volatile storage system 748 is configured to communicate with the host 752 using a small computer system interface (SCSI)-type protocol, such as a serial attached SCSI (SAS) protocol. As other examples, the non-volatile storage system 748 is configured to communicate with the host 752 using a NVM Express (NVMe) protocol or a serial advanced technology attachment (SATA) protocol. In other examples, the non-volatile storage system 748 operates in compliance with a JEDEC eMMC specification, a JEDEC Universal Flash Storage (UFS) specification, one or more other specifications, or a combination thereof, and is configured to communicate using one or more protocols, such as an eMMC protocol, a universal flash storage (UFS) protocol, a universal serial bus (USB) protocol, and/or another protocol, as illustrative, non-limiting examples.

In one embodiment, the host 752 includes a data storage interface (not shown) and is configured to communicate with a controller 738 of the non-volatile storage system 748 via the data storage interface to read data from and write data to one or more memory die 726 of the non-volatile storage system 748. For example, the host 752 is configured to communicate with the non-volatile storage system 748 using a SAS, SATA, or NVMe protocol. As other examples, the host 752 operates in compliance with a Joint Electron Devices Engineering Council (JEDEC) industry specification, such as a Universal Flash Storage (UFS) Access Controller Interface specification. The host 752 communicates with one or more memory die 726 in accordance with any other suitable communication protocol.

In one embodiment, the host 752 includes a processor and a memory. The memory is configured to store data and/or instructions that are executable by the processor. The memory is a single memory or multiple memories, such as one or more non-volatile memories, one or more volatile memories, or a combination thereof. The host 752 issues one or more commands to the non-volatile storage system 748, such as one or more requests to re-write data, erase data, read data from, or write (e.g., program) data to the one or more memory die 726 of the non-volatile storage system 748. For example, the host 752 is configured to provide data (e.g., user data) to be stored in the memory die(s) 726, to request data to be erased from the memory die(s) 726, and/or to request data to be read from the memory die(s) 726.

Examples of the host 752 include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The non-volatile storage system 748 includes one or more memory die 726 and a controller 738. While one memory die 726 is illustrated in FIG. 7, one or more memory die 726 (e.g., one memory die, two memory die, eight memory die, or another number of memory die) may interface with a single controller 738.

The memory die 726 includes a memory 728 such as a non-volatile memory of storage elements (as described in connection with FIG. 2, for example). In an embodiment, the memory 728 is a three-dimensional (3D) memory structure having an upper sub-block 102 and a lower sub-block 102 in at least one block 730. The controller 738 is configured to send data and/or commands 736 to the memory die 726 and to receive data 736 from the memory die 726 (as described in connection with FIG. 2, for example).

In an embodiment, the memory 728 includes one or more blocks 730 (as described in connection with FIG. 2, for example). Each block 730 of memory 728 includes two or more sub-blocks 102 (as described in connection with FIG. 2, for example).

In an embodiment, each memory die 726 includes other circuitry. For example, a memory die 726 includes a read/write circuit 762. The read/write circuit reads data from and/or writes data to the memory 728. For example, the read/write circuit 762 takes one or more measurements (e.g., sense measurements) from one or more blocks 730 of memory 728. The read/write circuit 762 maps the measurements to data (e.g., bits). For instance, the read/write circuit 762 determines which data states are indicated by the memory cells based on the measurement(s) and sends corresponding data 736 to the controller. The read/write circuit 762 is configured to write (e.g., program) the memory 728. For example, the read/write circuit 762 sends programming signals (e.g., one or more program pulses 737) to the memory 728 to program threshold voltages to the memory cells corresponding to data 736 received from the controller 738. In an embodiment, the read/write circuit 762 sends one or more pulses 737 to the memory 728, where the pulse(s) 737 may include one or more program pulses 737, one or more erase pulses 737, one or more compensating program pulses 737, and/or one or more compensating erase pulses 737, as described herein. In an embodiment, the read/write circuit 762 includes the measurement circuit 232 described in connection with FIG. 2 and/or performs one or more of the operations described in connection with the measurement circuit 232 of FIG. 2.

The controller 738 is configured to perform read or determination operations (e.g., initiate reads, measurements, or determinations), write operations (e.g., initiate writes), erase operations (e.g., initiate erases), and/or refresh operations. For example, the controller 738 reads the memory 728 (e.g., one or more blocks 730 and/or sub-blocks 102 of memory 728) by issuing a read command 736 to the memory die 726 (e.g., read/write circuit 762) and receiving data 736 from the memory 728 corresponding to the read command. The controller 738 writes to the memory 728 (e.g., one or more blocks 730 and/or sub-blocks 102 of memory 728) by issuing a write command 736 and sending data 736 to the memory die 726 (e.g., read/write circuit 762). The controller 738 erases the memory 728 (e.g., one or more blocks 730 and/or sub-blocks 102 of memory 728) by issuing an erase command 736. For example, the controller 738 erases data stored in an upper sub-block 102 or a lower sub-block 102 of the memory 728.

In an embodiment, the controller 738 is configured to detect unselected sub-block disturb. For example, the controller 738 initiates one or more reads or determinations of an unselected sub-block 102 at one or more offset thresholds. For example, the controller 738 issues a command 736 to the memory die 726 (e.g., read/write circuit) to read an unselected sub-block 102 at one or more offset thresholds. The offset thresholds may be offset from one or more read thresholds (e.g., normal read thresholds), offset from one or more target data states, and/or may correspond to one or more target data states (e.g., tails). In an example, the controller 738 initiates one or more reads of a sub-block 102 (e.g., upper sub-block 102 or lower sub-block 102) at one or more thresholds offset relative to one or more read thresholds. The controller 738 receives data corresponding to the one or more reads.

In an embodiment, the controller 738 includes a check circuit 750. The check circuit 750 may be an example of the detection circuit 234 described in connection with FIG. 2 in some embodiments. The check circuit 750 is configured to check data for errors. In an embodiment, data stored in the memory 728 is encoded with error check coding and/or error correction coding, such as LDPC or ECC.

In an embodiment, the controller 738 (e.g., check circuit 750) detects the disturb condition based on checking one or more measurements. In an example, the check circuit 750 performs error checking based on the data from one or more reads and/or determinations (e.g., one or more measurements). Examples of error checking include error checking based on ECC, LDPC codes, and/or BCH codes. In an embodiment, the controller 738 receives data 736 based on a read (e.g., measurement(s)) at one or more offset thresholds. A check failure of the data of the read (e.g., a read failure) indicates a disturb condition (program disturb and/or erase disturb). More specific examples of disturb detection based on error checking are given in connection with FIGS. 8A-C, 9A-C and 10.

In an embodiment, the controller 738 (e.g., check circuit 750) initiates data maintenance (e.g., refresh or restore) in response to the disturb condition. In an example, the controller 738 sets a refresh or recovery flag for a refresh or recovery to be performed on the unselected sub-block where the disturb condition has occurred.

FIG. 8A is a diagram illustrating another example of target data states 841a-b and offset thresholds 840a-b. In particular, FIG. 8A illustrates a plot with number of cells on the vertical axis and threshold voltage (Vt) on the horizontal axis. In an embodiment, the plot corresponds to SLC memory with two-offset erase/program disturb detection for a sub-block 102 and/or single word line.

In this example, a read threshold 844 (e.g., a read threshold for a normal read operation) is illustrated between a first target data state 841a and a second target data state 841b. In an embodiment, a first offset threshold 840a is offset relative to (e.g., −0.3 V below) the read threshold 844 (e.g., 3 V) and a second offset threshold 840b is offset relative to (e.g., +0.3 V above) the read threshold 844. In another embodiment, the first offset threshold 840a is offset relative to the first target data state 841a (e.g., at or above the upper tail of the first target data state 841a) and the second offset threshold 840b is offset relative to the second target data state 841b (e.g., at or below the second target data state 841b). In an embodiment, the first offset threshold 840*a* is associated with the first target data state 841*a* and the second offset threshold 840*b* is associated with the second target data state 841*b*. In the example of FIG. 8A, the first target data state 841*a* is adjacent to the second target data state 841*b* (e.g., without any other intervening target data state).

In an embodiment, the controller 738 initiates a first read (e.g., a disturb detection read) at the first offset threshold 840*a* and/or a second read (e.g., a disturb detection read) at the second offset threshold 840*b*. The check circuit 750 performs error checking on the data corresponding to the first read and/or the second read. In an embodiment, the check circuit 750 performs error checking on the data corresponding to the first read and/or the second read by performing error correction code (ECC) decoding to determine whether the first read and/or the second read pass or fail the check. For example, the check circuit 750 determines whether the error correction code indicates an error in the data stored in the unselected sub-block as read at the first offset threshold and/or the second offset threshold. In a case that the read is successful (e.g., the error check passes), then data maintenance (e.g., refresh) may not be needed (e.g., no significant disturb has occurred). In a case that the read fails (e.g., the error check indicates a failure), then data maintenance (e.g., refresh) may be performed (e.g., program and/or erase disturb is indicated).

FIG. 8B is a diagram illustrating another example of unselected sub-block program disturb 854. In particular, FIG. 8B illustrates a plot with number of cells on the vertical axis and threshold voltage (Vt) on the horizontal axis. A first fresh threshold voltage distribution corresponding to the first target data state 841*a* is illustrated and a second fresh threshold voltage distribution corresponding to the second target data state 841*b* is illustrated. A first threshold voltage distribution after cycling and a second threshold voltage distribution after cycling are also illustrated. The unselected sub-block program disturb 854 causes some cells corresponding to the first threshold voltage distribution to increase in threshold voltage.

In an embodiment, the controller 738 initiates a first read at the first offset threshold 840*a* and a second read at the second offset threshold 840*b* as described above. The check circuit 750 determines whether the first read and/or the second fails an error check. In the example illustrated in FIG. 8B, because the first read fails the error check, the controller 738 (e.g., check circuit 750) detects a disturb condition. Accordingly, the controller 738 initiates data maintenance in response to the failure. For example, the controller 738 commands a refresh of the data in the unselected sub-block in response to the detected disturb condition. In the example in FIG. 8B, the second threshold voltage distribution after cycling passes the error check. Accordingly, the controller 738 is able to distinguish between program disturb and erase disturb.

FIG. 8C is a diagram illustrating another example of unselected sub-block erase disturb 860. In particular, FIG. 8B illustrates a plot with number of cells on the vertical axis and threshold voltage (Vt) on the horizontal axis. A first fresh threshold voltage distribution corresponding to the first target data state 841*a* is illustrated and a second fresh threshold voltage distribution corresponding to the second target data state 841*b* is illustrated. A first threshold voltage distribution after cycling and a second threshold voltage distribution after cycling are also illustrated. The unselected sub-block erase disturb 860 causes some cells corresponding to the second threshold voltage distribution to decrease in threshold voltage.

In an embodiment, the controller 738 initiates a first read at the first offset threshold 840*a* and a second read at the second offset threshold 840*b* as described above. The check circuit 750 determines whether the first read and/or the second fails an error check. In the example illustrated in FIG. 8C, because the second read fails the error check, the controller 738 (e.g., check circuit 750) detects a disturb condition. Accordingly, the controller 738 initiates data maintenance in response to the failure. For example, the controller 738 commands a refresh of the data in the unselected sub-block in response to the detected disturb condition. In the example in FIG. 8C, the first threshold voltage distribution after cycling passes the error check. Accordingly, the controller 738 is able to distinguish between program disturb and erase disturb.

FIG. 9A is a diagram illustrating another example of target data states 941*a-h* and offset thresholds 940*a-b*. In particular, FIG. 9A illustrates a plot with number of cells on the vertical axis and threshold voltage (Vt) on the horizontal axis. In an embodiment, the plot corresponds to TLC memory with two-offset erase/program disturb detection read for a sub-block 102 and/or single word line.

In this example, a first read threshold 944*a* (e.g., a read threshold for a normal read operation) is located between the first target data state 941*a* and the second target data state 941*b*. In an embodiment, a first offset threshold 940*a* is offset relative to (e.g., −0.1 V below) the first read threshold 944*a* (e.g., 0.5 V). In another embodiment, the first offset threshold 940*a* is offset relative to the first target data state 941*a* (e.g., at or above the upper tail of the first target data state 941*a*). In an embodiment, the first offset threshold 940*a* is associated with the first target data state 941*a*. In the example of FIG. 9A, the first target data state 941*a* is adjacent to the second target data state 941*b* (e.g., without any other intervening target data state).

In this example, a second read threshold 944*b* (e.g., a read threshold for a normal read operation) is located between a third target data state 941*g* and a fourth target data state 941*h*. In an embodiment, a second offset threshold 940*b* is offset relative to (e.g., +0.1 V above) the second read threshold 944*b* (e.g., 5.6 V). In another embodiment, the second offset threshold 940*b* is offset relative to the fourth target data state 941*h* (e.g., at or below the fourth target data state 941*h*). In an embodiment, the second offset threshold 940*b* is associated with the fourth target data state 941*h*. In the example of FIG. 9A, the third target data state 941*g* is adjacent to the fourth target data state 941*h* (e.g., without any other intervening target data state). Additionally, the third target data state 941*g* is non-adjacent to the second target data state 941*b* (e.g., the third target data state 941*g* is separated from the second target data state 941*b* by one or more target data states 941*c-g*). Additionally, the second offset threshold 940*b* is separated from the first offset threshold 940*a* by one or more target data states 941*b-g*.

In an embodiment, the controller 738 initiates a first read (e.g., a disturb detection read) at the first offset threshold 940*a* and a second read (e.g., a disturb detection read) at the second offset threshold 940*b*. The check circuit 750 performs error checking on the data corresponding to the first read and/or the second read. In an embodiment, the check circuit 750 performs error checking on the data corresponding to the first read and/or the second read by performing error correction code (ECC) decoding to determine whether the first read and/or the second read pass the check. For example, the check circuit 750 determines whether the error correction code indicates an error in the data stored in the unselected sub-block as read at the first offset threshold and/or the second offset threshold. In a case that the read is successful (e.g., the error check passes), then data maintenance (e.g., refresh) may not be needed (e.g., no significant disturb has occurred). In a case that the read fails (e.g., the error check indicates a failure), then data maintenance (e.g., refresh) may be performed (e.g., significant disturb has occurred).

FIG. 9B is a diagram illustrating another example of unselected sub-block program disturb 954. In particular, FIG. 9B illustrates a plot with number of cells on the vertical axis and threshold voltage (Vt) on the horizontal axis. A first fresh threshold voltage distribution corresponding to the first target data state 941a is illustrated and a second fresh threshold voltage distribution corresponding to the second target data state 941h is illustrated. A first threshold voltage distribution after cycling and a second threshold voltage distribution after cycling are also illustrated. The unselected sub-block program disturb 954 causes some cells corresponding to the first threshold voltage distribution to increase in threshold voltage. For example, a number of cells of the first threshold voltage distribution increases above the first offset threshold (e.g., the upper tail shifts) over a number of programming cycles.

In an embodiment, the controller 738 initiates a first read at the first offset threshold 940a and/or a second read at the second offset threshold 940b as described above. The check circuit 750 determines whether the first read passes or fails an error check and/or whether the second read passes or fails an error check as described above.

In the example illustrated in FIG. 9B, because the first read fails the error check, the controller 738 (e.g., check circuit 750) detects a disturb condition. Accordingly, the controller 738 initiates data maintenance. For example, the controller 738 commands a refresh of the data in the unselected sub-block in response to the detected disturb condition. In the example in FIG. 9B, the second threshold voltage distribution after cycling passes the error check. Accordingly, the controller 738 is able to distinguish between program disturb and erase disturb.

FIG. 9C is a diagram illustrating another example of unselected sub-block erase disturb 960. In particular, FIG. 9C illustrates a plot with number of cells on the vertical axis and threshold voltage (Vt) on the horizontal axis. A first fresh threshold voltage distribution corresponding to the first target data state 941a is illustrated and a second fresh threshold voltage distribution corresponding to the second target data state 941h is illustrated. A first threshold voltage distribution after cycling and a second threshold voltage distribution after cycling are also illustrated. The unselected sub-block erase disturb 960 causes some cells corresponding to the fourth threshold voltage distribution to decrease in threshold voltage. For example, a number of cells of the second threshold voltage distribution decreases below the second offset threshold 940b (e.g., the lower tail shifts) over a number of erases.

In an embodiment, the controller 738 initiates a first read at the first offset threshold 940a and/or a second read at the second offset threshold 940b as described above. The check circuit 750 determines whether the first read passes or fails an error check and/or whether the second read passes or fails an error check as described above.

In the example illustrated in FIG. 9C, because the second read fails the error check, the controller 738 (e.g., check circuit 750) detects a disturb condition. Accordingly, the controller 738 initiates data maintenance. For example, the controller 738 commands a refresh of the data in the unselected sub-block in response to the detected disturb condition. In the example in FIG. 9C, the first threshold voltage distribution after cycling passes the error check. Accordingly, the controller 738 is able to distinguish between program disturb and erase disturb.

Figure 10:
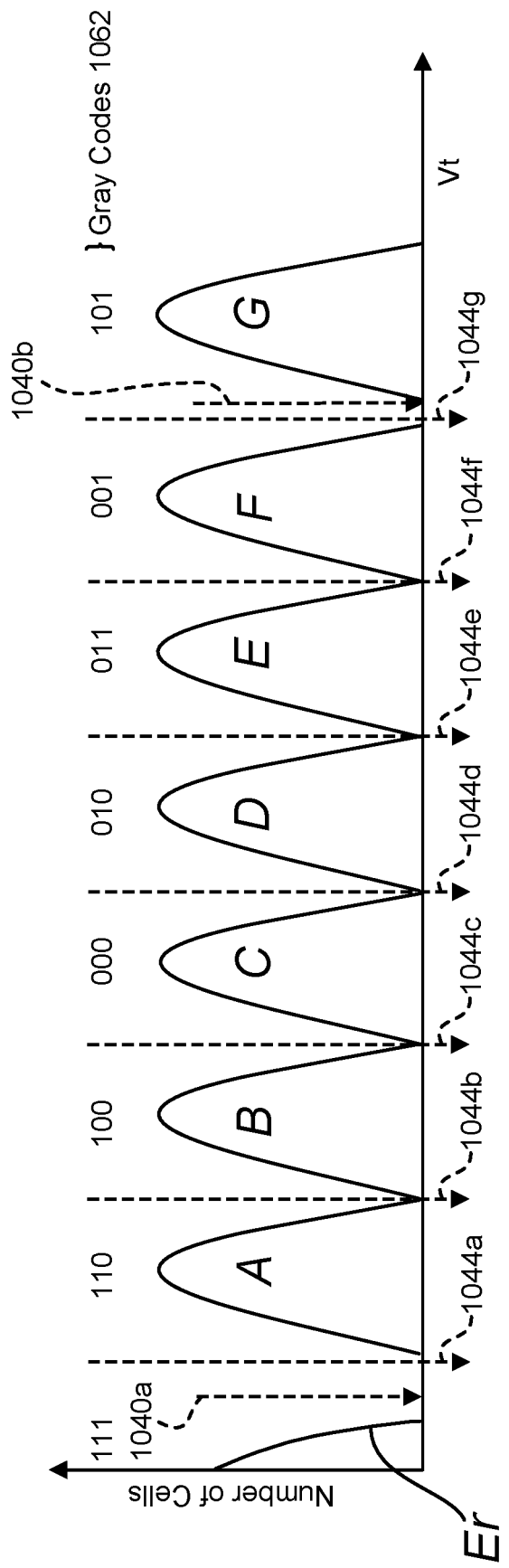
FIG. 10 is a diagram illustrating an example of target data states, read thresholds, and offset thresholds.

FIG. 10 is a diagram illustrating an example of target data states, read thresholds 1044a-g, and offset thresholds 1040a-b. In particular, FIG. 10 illustrates a plot with number of cells on the vertical axis and threshold voltage (Vt) on the horizontal axis. In this example, the target data states include and/or are referred to as an erase state (Er) and A-G states. To measure and/or read the states, seven read threshold 1044a-g between adjacent states may be utilized. In an embodiment, a first read threshold 1044a is approximately 0.5 V (between Er and A), a second read threshold 1044b is approximately 1.4 V (between A and B), a third read threshold 1044c is approximately 2.1 V (between B and C), a fourth read threshold 1044d is approximately 3.0 V (between C and D), a fifth read threshold 1044e is approximately 3.7 V (between D and E), a sixth read threshold 1044f is approximately 4.6 V (between E and F), and a seventh read threshold 1044g is approximately 5.6 V (between F and G).

In an embodiment, Gray codes 1062 are mapped to each of the target data states. The Gray codes 1062 may be mapped to the target data states such that adjacent target data states differ by only one bit to reduce the number of bit errors in a case that threshold voltage shifts. Each bit position of the Gray code may correspond to a page. For example, the right-most bit position corresponds to a lower page, the middle bit position corresponds to a middle page, and the left-most bit position corresponds to an upper page.

In an embodiment, two reads are performed to determine the lower page bit. In this example, a read at a first read threshold 1044a (corresponding to target data state A) is performed and a read at a fifth read threshold 1044e (corresponding to target data state E) is performed to determine the lower page bit. In an embodiment, the memory is measured and/or read (by the measurement circuit 232 and/or the controller 738) at the first offset threshold 1040a (instead of the first read threshold 1044a) and at the fifth read threshold in order to detect unselected sub-block program disturb. For example, the controller 738 sends a lower page read command with an offset threshold 1040a (lower than the first read threshold 1044a). In a case that the lower page read fails, a disturb condition is detected (e.g., unselected sub-block program disturb is too high), and a data refresh is triggered.

In an embodiment, two reads are performed to determine the upper page bit. In this example, a read at a third read threshold 1044c (corresponding to target data state C) is performed and a read at a seventh read threshold 1044g (corresponding to target data state G) is performed to determine the upper page bit. In an embodiment, the memory is measured and/or read (by the measurement circuit 232 and/or the controller 738) at the third read threshold 1044c and at the second offset threshold 1040b (instead of the seventh read threshold 1044g) in order to detect unselected sub-block erase disturb. For example, the controller 738 sends an upper page read command with an offset threshold 1040b (higher than the seventh read threshold 1044g). In a case that the upper page read fails, a disturb condition is detected (e.g., unselected sub-block erase disturb is too high), and a data refresh is triggered. In an embodiment, a middle page read may be performed with the second read threshold 1044b, the fourth read threshold 1044d, and the sixth read threshold 1044f. In an embodiment, the reads described in connection with FIGS. 9A-C are performed in accordance with the approach described in connection with FIG. 10.

It should be noted that in some embodiments, a data scrambler (on a memory die 226 or NAND chip, for example) is utilized to ensure that stored data are in a random format. For TLC, for instance, approximately $\frac{1}{8}^{th}$ of the cells will be in the Er state, approximately $\frac{1}{8}^{th}$ of the cells will be in the A state, approximately $\frac{1}{8}^{th}$ of the cells will be in the B state, approximately $\frac{1}{8}^{th}$ of the cells will be in the C state, approximately $\frac{1}{8}^{th}$ of the cells will be in the D state, approximately $\frac{1}{8}^{th}$ of the cells will be in the E state, approximately $\frac{1}{8}^{th}$ of the cells will be in the F state, and approximately $\frac{1}{8}^{th}$ of the cells will be in the G state.

Figure 11:
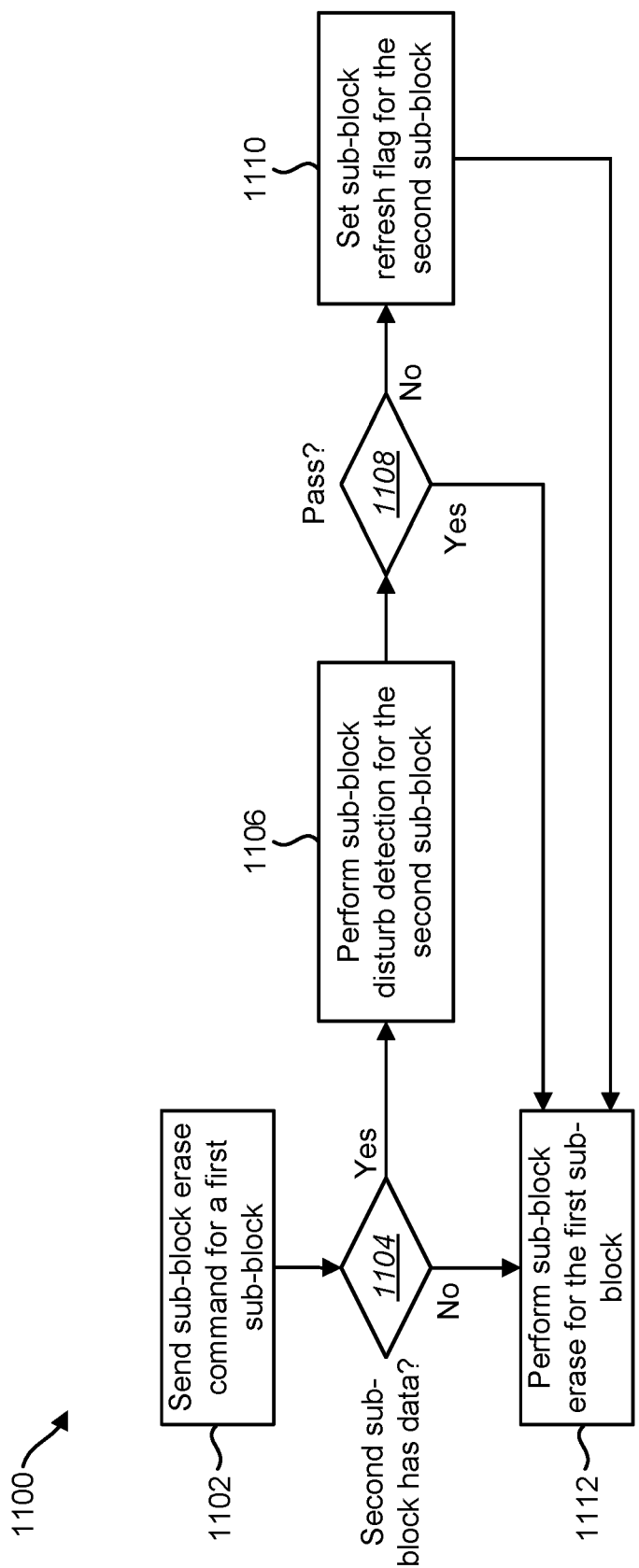
FIG. 11 is a flow diagram illustrating an example of a method for disturb detection using error checking.

FIG. 11 is a flow diagram illustrating an example of a method 1100 for disturb detection using error checking. In an embodiment, circuitry (e.g., a controller 238, 738) performs the method 1100. In an embodiment, a non-volatile storage device performs the method 1100. The method may be performed for SLC, MLC, or TLC memory 228.

In the example described in connection with FIG. 11, reference is made to a first sub-block 102 and a second sub-block 102. The first sub-block 102 and the second sub-block 102 are in the same block 230 of memory 228. The first sub-block 102 and the second sub-block 102 may or may not be all of the sub-blocks 102 in the block 230. In one scenario, the first sub-block 102 is an upper sub-block and the second sub-block 102 is a lower sub-block. In another scenario, the first sub-block 102 is a lower sub-block and the second sub-block 102 is an upper sub-block.

A controller 738 sends 1102 a sub-block erase command for a first sub-block. This is accomplished as described in connection with FIG. 7. For example, the controller 738 sends a command to the memory die 726 to erase a first sub-block 102 (e.g., an upper sub-block or a lower sub-block) in the memory 728.

The controller 738 determines 1104 whether a second sub-block 102 has data (e.g., is currently storing data). For example, the controller 738 checks a record (e.g., controller 738 log) and/or the second sub-block to determine whether the data stored in the second sub-block is flagged as erase (e.g., over-writable or garbage). In a case that the second sub-block 102 does not have data (e.g., does not have data to be maintained), the memory die 726 performs 1112 the sub-block erase for the first sub-block.

In a case that the second sub-block 102 has data, the controller 738 performs 1106 sub-block disturb detection for the second sub-block. This is accomplished as described in connection with one or more of FIGS. 2-10. In an embodiment, a cell count between at least two offset thresholds is determined (by the controller 238 and/or the measurement circuit 232). In an embodiment, the controller initiates a read at one or more offset thresholds.

The controller 238 determines 1108 whether the second sub-block 102 passes 1108 disturb detection. This is accomplished as described in connection with FIG. 2. In an embodiment, the controller 238 determines whether a cell count based on offset thresholds does not satisfy a threshold. In an embodiment, the controller 238 determines whether a read with an offset threshold has passed an error check. In a case that the sub-block 102 passes the disturb detection, the memory die 726 performs 1112 the sub-block erase for the first sub-block 102 (e.g., without needing data refresh).

In a case that the second sub-block 102 fails the disturb detection, the controller 238 sets 1110 a sub-block refresh or recovery flag for the second sub-block. This is accomplished as described in connection with FIG. 2. For example, the controller 238 sets the second sub-block 102 for a refresh or recovery operation (as a background procedure, for example). In an embodiment, the controller 238 sets 1110 the sub-block refresh or recovery flag in response to the controller 238 receiving a refresh or recovery request from the memory die 226 (e.g., from the detection circuit 234a). In another embodiment, the controller 238 sets 1110 the sub-block refresh or recovery flag in response to detecting the disturb condition (e.g., by the detection circuit 234b).

In an embodiment, data maintenance (e.g., refresh) for an unselected sub-block 102 is performed as follows. The controller 238 checks a refresh or recovery flag for an unselected sub-block 102. In a case that the unselected sub-block 102 is flagged for refresh or recovery, the controller inhibits selected sub-block programming, performs unselected sub-block refresh or recovery, and resets the unselected sub-block refresh or recovery flag (e.g., from 1 to 0). Upon completing the unselected sub-block refresh or recovery, selected sub-block programming is allowed.

In an embodiment, data maintenance (e.g., refresh or recovery) is performed by moving data to another physical location. For example, data in a first physical location is refreshed or recovered by writing the data to a second physical location and marking the first physical location for invalidity and/or erase in a controller 238 log. In an embodiment, data maintenance (e.g., refresh or recovery) is performed at the same physical location. For example, data in a physical location is refreshed or recovered by the controller 238 reading the data, erasing the physical location, and writing the data back to the same physical location.

An embodiment of an apparatus disclosed herein includes an array of memory cells comprising a first sub-block and a second sub-block electrically coupled by a channel. The apparatus further includes a measurement circuit configured to take a first measurement of a first sub-block of memory cells at a first offset threshold and a second measurement of the first sub-block of memory cells at a second offset threshold. The apparatus also includes a detection circuit configured to detect a disturb condition of the first sub-block based on at least one of the first measurement and the second measurement, and to initiate data maintenance in response to the disturb condition of the first sub-block.

In an embodiment of the apparatus, the first offset threshold is offset relative to a read threshold. In an embodiment, a cell count within at least one range based on the first measurement and the second measurement indicates the disturb condition of the first sub-block. In an embodiment, the disturb condition is indicated by a check failure of the first measurement and the second measurement.

An embodiment of a maintenance circuit disclosed herein is configured to program a first sub-block in an array of memory cells, the array of memory cells including the first sub-block and a second sub-block electrically coupled by a channel. The maintenance circuit is further configured to determine a number of memory cells of the second sub-block between a first target data state and a second target data state. The maintenance circuit is also configured to detect a disturb condition of the second sub-block based at least in part on the number of memory cells satisfying a threshold. The maintenance circuit is additionally configured to send, in response to the detected disturb condition, a notification to a controller to cause the controller to perform data maintenance of the second sub-block.

In an embodiment of the maintenance circuit, the first target data state is adjacent to the second target data state. In an embodiment, the number of memory cells is a difference between a first number of memory cells corresponding to a first offset threshold and a second number of memory cells corresponding to a second offset threshold. In an embodiment, the maintenance circuit is configured to determine the number of memory cells including a second number of memory cells between a third offset threshold and a fourth offset threshold. In an embodiment, the third offset threshold is separated from a second offset threshold by a third target data state.

An embodiment of a non-volatile storage system disclosed herein includes a three-dimensional (3D) memory structure having an upper sub-block and a lower sub-block. The non-volatile storage system also includes a controller configured to erase first data stored in the upper sub-block and to initiate a read of the lower sub-block at a first threshold offset relative to a read threshold. The non-volatile storage system further includes a check circuit configured to perform error correction code (ECC) decoding to determine a failure of the read, where the controller is configured to initiate a refresh in response to the failure.

In an embodiment of the non-volatile storage system, the failure of the read indicates a program disturb. In an embodiment, the controller is configured to initiate a second read of the lower sub-block of memory at a second threshold offset from a second read threshold, and to determine a failure of the second read. In an embodiment, the failure of the second read indicates an erase disturb.

In an embodiment of a method disclosed herein, the method includes determining a first cell count for a sub-block of memory based on a first threshold that is offset above a read threshold and is associated with a first state. The method also includes determining a second cell count for the sub-block of memory based on a second threshold that is offset below the read threshold and is associated with a second state. The method further includes calculating a cell count between the first threshold and the second threshold based on the first cell count and the second cell count. The method additionally includes determining that a disturb condition exists based at least in part on the cell count satisfying a threshold. The method also includes restoring data of the sub-block of memory in response to the disturb condition.

In an embodiment of the method, calculating the cell count comprises subtracting the first cell count for the first threshold from the second cell count for the second threshold. In an embodiment, calculating the cell count further comprises subtracting a third cell count of a third threshold from a fourth cell count of a fourth threshold. In an embodiment, the third threshold is associated with a third state and the fourth threshold is associated with a fourth state.

An embodiment of an apparatus disclosed herein includes a memory die and a controller. The controller includes means for initiating a first determination for a sub-block of the memory die at a first offset threshold associated with a first state and for initiating a second determination for the sub-block at a second offset threshold associated with a second state. The controller also includes means for checking data of the first determination or the second determination for a failure. The controller further includes means for recovering data stored in the sub-block in response to the failure.

In an embodiment of the apparatus, the means for checking data is based on an error correction code. In an embodiment, the apparatus includes means for setting a recovery flag in response to the failure. In an embodiment, the means for recovering the data initiates recovery as a background procedure in response to the setting the recovery flag.

A means for initiating a first determination and a second determination, in one embodiment, may include a controller 238 and/or controller 738. Other embodiments may include similar or equivalent means for initiating a first determination and a second determination.

A means for checking data of the first determination and the second determination for a failure, in one embodiment, may include a controller 238, detection circuit 234b, controller 738, and/or check circuit 750. Other embodiments may include similar or equivalent means for checking data.

A means for recovering data stored in the sub-block in response to the failure, in one embodiment, may include a controller 238, detection circuit 234b, controller 738, and/or check circuit 750. Other embodiments may include similar or equivalent means for recovering data.

A means for setting a recovery flag in response to the failure, in one embodiment, may include a controller 238, detection circuit 234b, controller 738, and/or check circuit 750. Other embodiments may include similar or equivalent means for setting a recovery flag.

As used in this application, the terms "an embodiment," "one embodiment," "another embodiment," or analogous language do not refer to a single variation of the disclosed subject matter; instead, this language refers to variations of the disclosed subject matter that may be applied and used with a number of different implementations of the disclosed subject matter.

One of skill in the art will recognize that this disclosure is not limited to the two-dimensional and three-dimensional exemplary structures described but covers all relevant memory structures within the spirit and scope of the disclosure as described herein and as understood by one of skill in the art. The illustrations of the embodiments described herein are intended to provide a general understanding of the embodiments. Other embodiments may be utilized and derived from the disclosure, such that structural and logical substitutions and changes may be made without departing from the scope of the disclosure. This disclosure is intended to cover any and all subsequent adaptations or variations of embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An apparatus, comprising:
an array of memory cells comprising a first sub-block and a second sub-block electrically coupled by a channel;
a measurement circuit configured to take a first measurement of the first sub-block of memory cells at a first offset threshold and a second measurement of the first sub-block of memory cells at a second offset threshold;
a detection circuit configured to detect a disturb condition of the first sub-block based on at least one of the first measurement or the second measurement; and
a write circuit configured to send a compensating pulse in response to the detection circuit detecting the disturb condition of the first sub-block in order to counter a change in an electric characteristic of the first sub-block away from a target level.

2. The apparatus of claim 1, wherein the first offset threshold is offset below a read threshold and the second offset threshold is offset above the read threshold.

3. The apparatus of claim 1, wherein:
the measurement circuit is configured to utilize the first measurement and the second measurement to determine a cell count within a range between the first offset threshold and the second offset threshold; and
the detection circuit is configured to detect the disturb condition of the first sub-block in response to the cell count satisfying a cell count threshold.

4. The apparatus of claim 1, wherein the disturb condition is indicated by a check failure of one or more of the first measurement or the second measurement.

5. The apparatus of claim 1, wherein when the disturb condition of the first sub-block comprises a program disturb, the compensating pulse sent by the write circuit comprises a compensating erase pulse.

6. The apparatus of claim 5, wherein the compensating erase pulse has a lower amplitude in comparison with a normal erase pulse in order to shift a threshold voltage downward by an amount without completely erasing one or more memory cells of the first sub-block.

7. The apparatus of claim 1, wherein when the disturb condition of the first sub-block comprises a program disturb, the compensating pulse sent by the write circuit comprises a compensating program pulse.

8. The apparatus of claim 7, wherein the compensating program pulse has a lower amplitude in comparison with a normal program pulse in order to shift a threshold voltage upward by an amount without increasing the threshold voltage of one or more memory cells of the first sub-block beyond a target threshold voltage level.

9. An apparatus, comprising:
an array of memory cells comprising a first sub-block and a second sub-block electrically coupled by a channel;
one or more circuits configured to
take a first measurement of the first sub-block of memory cells at a first offset threshold and a second measurement of the first sub-block of memory cells at a second offset threshold,
detect a disturb condition of the first sub-block based on at least one of the first measurement or the second measurement, and
send a compensating pulse, in response to the disturb condition of the first sub-block being detected, in order to counter a change in an electric characteristic of the first sub-block away from a target level.

10. The apparatus of claim 9, wherein the first offset threshold is offset below a read threshold and the second offset threshold is offset above the read threshold.

11. The apparatus of claim 9, wherein the one or more circuits are configured to:
utilize the first measurement and the second measurement to determine a cell count within a range between the first offset threshold and the second offset threshold; and
detect the disturb condition of the first sub-block in response to the cell count satisfying a cell count threshold.

12. The apparatus of claim 9, wherein the disturb condition is indicated by a check failure of one or more of the first measurement or the second measurement.

13. The apparatus of claim 9, wherein when the disturb condition of the first sub-block comprises a program disturb, the compensating pulse that is sent comprises a compensating erase pulse.

14. The apparatus of claim 13, wherein the compensating erase pulse has a lower amplitude in comparison with a normal erase pulse in order to shift a threshold voltage downward by an amount without completely erasing one or more memory cells of the first sub-block.

15. The apparatus of claim 9, wherein when the disturb condition of the first sub-block comprises a program disturb, the compensating pulse that is sent comprises a compensating program pulse.

16. The apparatus of claim 15, wherein the compensating program pulse has a lower amplitude in comparison with a normal program pulse in order to shift a threshold voltage upward by an amount without increasing the threshold voltage of one or more memory cells of the first sub-block beyond a target threshold voltage level.

17. A method, comprising:
taking a first measurement of a first sub-block of memory cells at a first offset threshold and taking a second measurement of the first sub-block of memory cells at a second offset threshold, wherein the first sub-block of memory cells are included within an array of memory cells that also includes a second sub-block of memory cells that is coupled to the first sub-block by a channel;
detecting a disturb condition of the first sub-block based on at least one of the first measurement or the second measurement; and
sending a compensating pulse in response to the detecting the disturb condition of the first sub-block in order to counter a change in an electric characteristic of the first sub-block away from a target level.

18. The method of claim 17, wherein the first offset threshold is offset below a read threshold and the second offset threshold is offset above the read threshold.

19. The method of claim 17, wherein the detecting the disturb condition comprises:
utilizing the first measurement and the second measurement to determine a cell count within a range between the first offset threshold and the second offset threshold; and
detecting the disturb condition of the first sub-block in response to the cell count satisfying a cell count threshold.

20. The method of claim 17, wherein the disturb condition is indicated by a check failure of one or more of the first measurement or the second measurement.

21. The method of claim 17, wherein when the disturb condition of the first sub-block comprises a program disturb, the compensating pulse that is sent comprises a compensating program pulse.

22. The method of claim 21, wherein the compensating program pulse has a lower amplitude in comparison with a normal program pulse in order to shift a threshold voltage upward by an amount without increasing the threshold voltage of one or more memory cells of the first sub-block beyond a target threshold voltage level.

23. The method of claim 17, wherein when the disturb condition of the first sub-block comprises a program disturb, the compensating pulse that is sent comprises a compensating erase pulse.

24. The method of claim 23, wherein the compensating erase pulse has a lower amplitude in comparison with a normal erase pulse in order to shift a threshold voltage downward by an amount without completely erasing one or more memory cells of the first sub-block.

* * * * *